United States Patent
Yoshida et al.

(10) Patent No.: US 10,256,272 B2
(45) Date of Patent: Apr. 9, 2019

(54) RESISTIVE MEMORY DEVICE CONTAINING ETCH STOP STRUCTURES FOR VERTICAL BIT LINE FORMATION AND METHOD OF MAKING THEREOF

(71) Applicant: SANDISK TECHNOLOGIES LLC, Plano, TX (US)

(72) Inventors: Yusuke Yoshida, Yokkaichi (JP); Akira Nakada, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/633,092

(22) Filed: Jun. 26, 2017

(65) Prior Publication Data

US 2018/0374899 A1   Dec. 27, 2018

(51) Int. Cl.
 *H01L 45/00* (2006.01)
 *H01L 27/24* (2006.01)
 *H01L 21/8234* (2006.01)

(52) U.S. Cl.
 CPC .. *H01L 27/2454* (2013.01); *H01L 21/823487* (2013.01); *H01L 45/06* (2013.01); *H01L 45/085* (2013.01); *H01L 45/1233* (2013.01); *H01L 45/1608* (2013.01)

(58) Field of Classification Search
 None
 See application file for complete search history.

(56) References Cited

U.S. PATENT DOCUMENTS

| 5,915,167 | A | 6/1999 | Leedy |
| 7,800,934 | B2 | 9/2010 | Kumar et al. |
| 8,237,146 | B2 | 8/2012 | Kreupl et al. |
| 9,343,507 | B2 | 5/2016 | Takaki |
| 9,437,658 | B2 | 9/2016 | Sakotsubo |
| 9,911,790 | B1 * | 3/2018 | Shimabukuro ....... H01L 27/249 |
| 2012/0001142 | A1 | 1/2012 | Caimi et al. |
| 2013/0043455 | A1 | 2/2013 | Bateman |
| 2013/0214239 | A1 | 8/2013 | Caimi et al. |
| 2014/0167131 | A1 * | 6/2014 | Lu ....................... H01L 29/7889 257/316 |

(Continued)

FOREIGN PATENT DOCUMENTS

WO   WO 2007/004843 A1   1/2007

OTHER PUBLICATIONS

Chen, Y. et al., "Vacancy-Modulated Conductive Oxide Resistive Ram Device Including an Interfacial Oxygen Source Layer," U.S. Appl. No. 15/228,216, filed Aug. 4, 2016.

(Continued)

*Primary Examiner* — Ali Naraghi

(74) *Attorney, Agent, or Firm* — The Marbury Law Group PLLC

(57) ABSTRACT

A three dimensional ReRAM device includes an etch stop dielectric material layer overlying top surfaces of the dielectric rail structures and the dielectric pillar structures. The etch stop dielectric material layer includes openings in areas that overlie semiconductor pillars of the vertical select transistors. An array of metal nitride portions is located within the openings in the etch stop dielectric material layer. The etch stop dielectric material layer protects the underlying dielectric pillar structures during anisotropic etching steps without covering the metal nitride portions.

10 Claims, 48 Drawing Sheets

(56) References Cited

U.S. PATENT DOCUMENTS

| | | | |
|---|---|---|---|
| 2015/0263069 A1 | 9/2015 | Jo | |
| 2015/0279855 A1* | 10/2015 | Lu | H01L 27/11582 257/66 |
| 2016/0043143 A1 | 2/2016 | Sakotsubo | |
| 2016/0111517 A1* | 4/2016 | Wu | H01L 45/08 438/154 |
| 2017/0309819 A1* | 10/2017 | Wu | H01L 45/146 |
| 2018/0158947 A1* | 6/2018 | Yeh | H01L 29/7827 |
| 2018/0261649 A1* | 9/2018 | Annunziata | H01L 27/222 |

OTHER PUBLICATIONS

Govoreanu, et al., Vacancy-Modulated Conductive Oxide Resistive RAM (VMCO-RRAM): An Area-Scalable Switching Current, Self Compliant, Highly Nonlinear and Wide On/Off-Window Resistive Switching Cell, IEDM13, 2013, pp. 256-259, Leuven-Belgium.

Zhang, L., "Study of the Selector Element for Resistive Memory" ), Ku Leuven Arenberg Doctoral School-Faculty of Engineering of Science, Oct. 2015, pp. 232, Haverly-Belgium (4 Parts).

Jo, S.H. et al., "Cross-Point Resistive RAM Based on Field-Assisted Superlinear Threshold Selector", IEEE Transactions on Electron Devices, vol. 62 No. 11, Nov. 2015, pp. 3477-3481.

U.S. Appl. No. 15/157,945, filed May 18, 2016, SanDisk Technologies LLC.

U.S. Appl. No. 15/228,216, filed Aug. 4, 2016, SanDisk Technologies LLC.

U.S. Appl. No. 15/581,078, filed Apr. 28, 2017, SanDisk Technologies LLC.

U.S. Appl. No. 15/611,029, filed Jun. 1, 2017, SanDisk Technologies LLC.

* cited by examiner

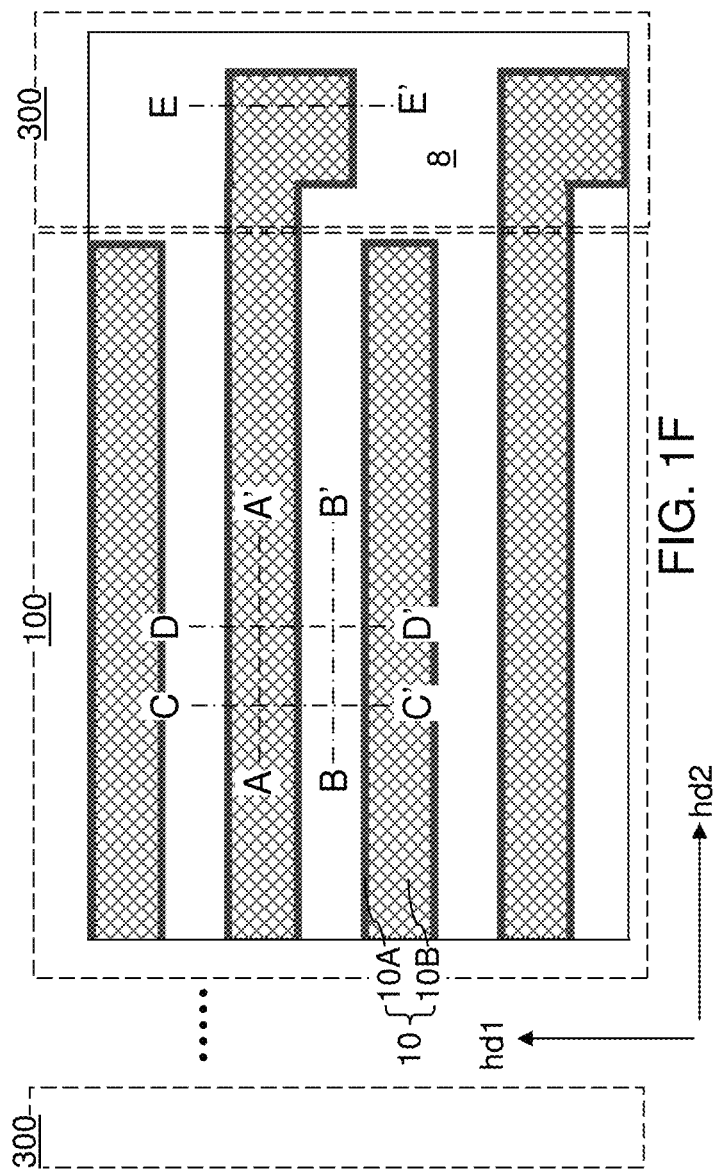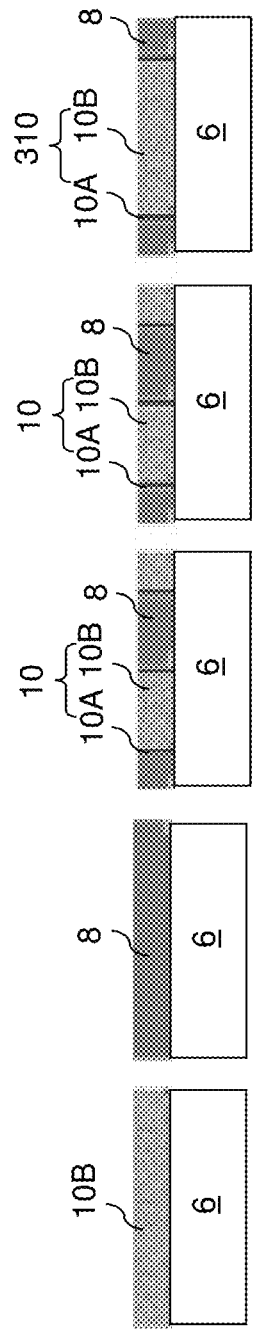

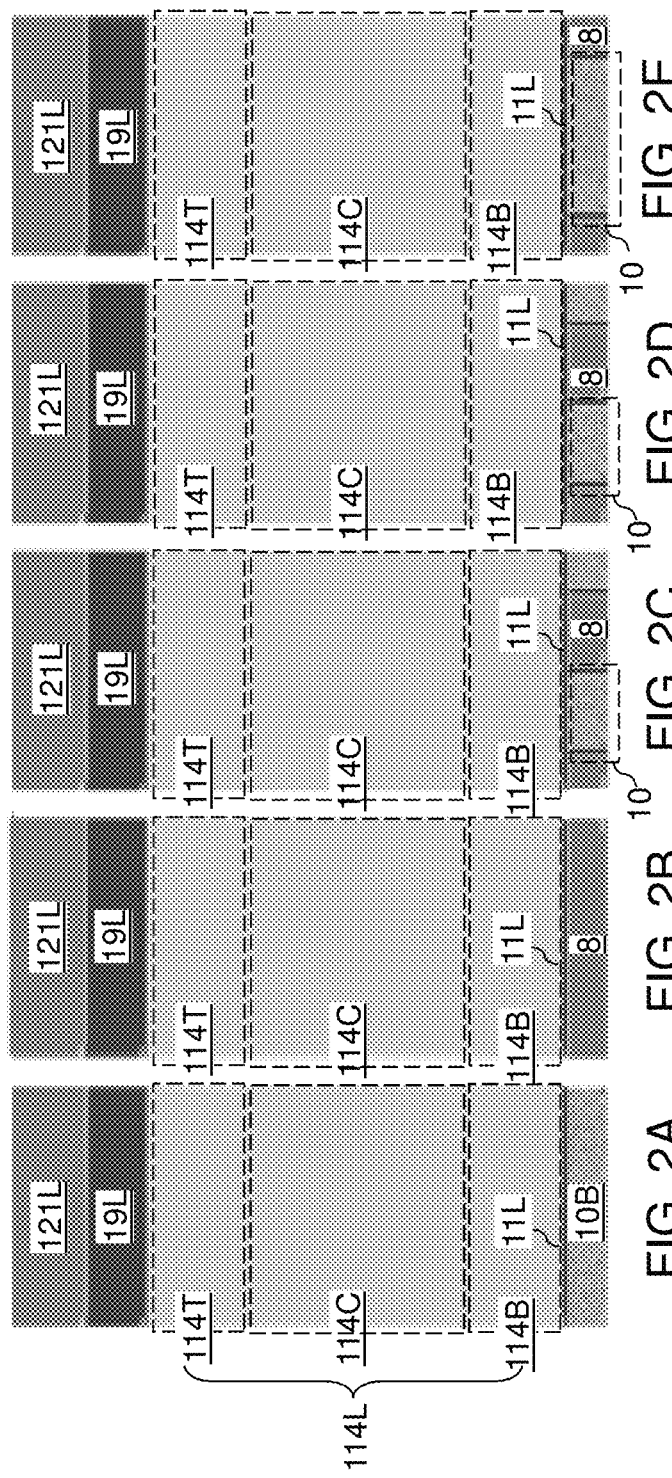

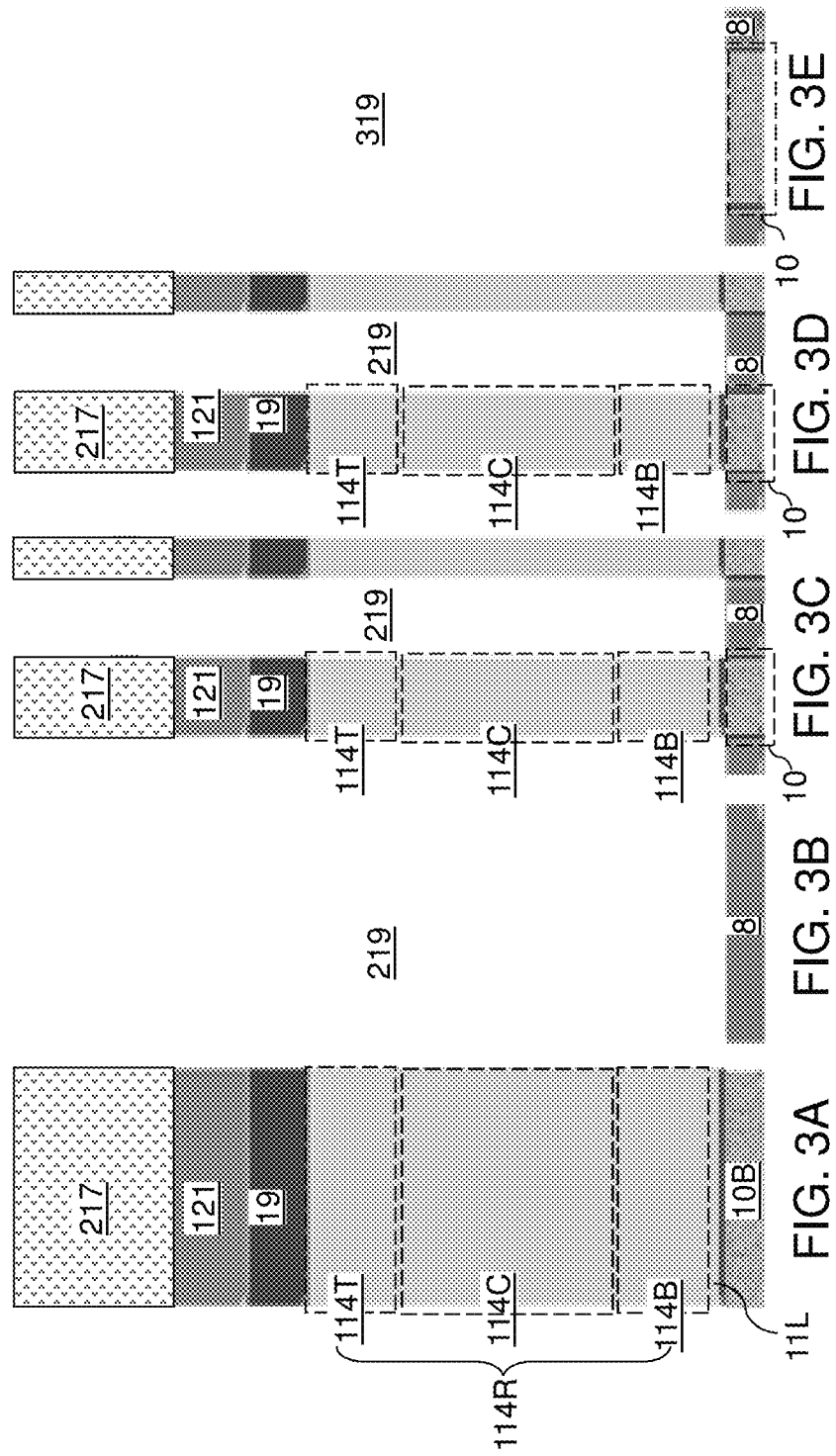

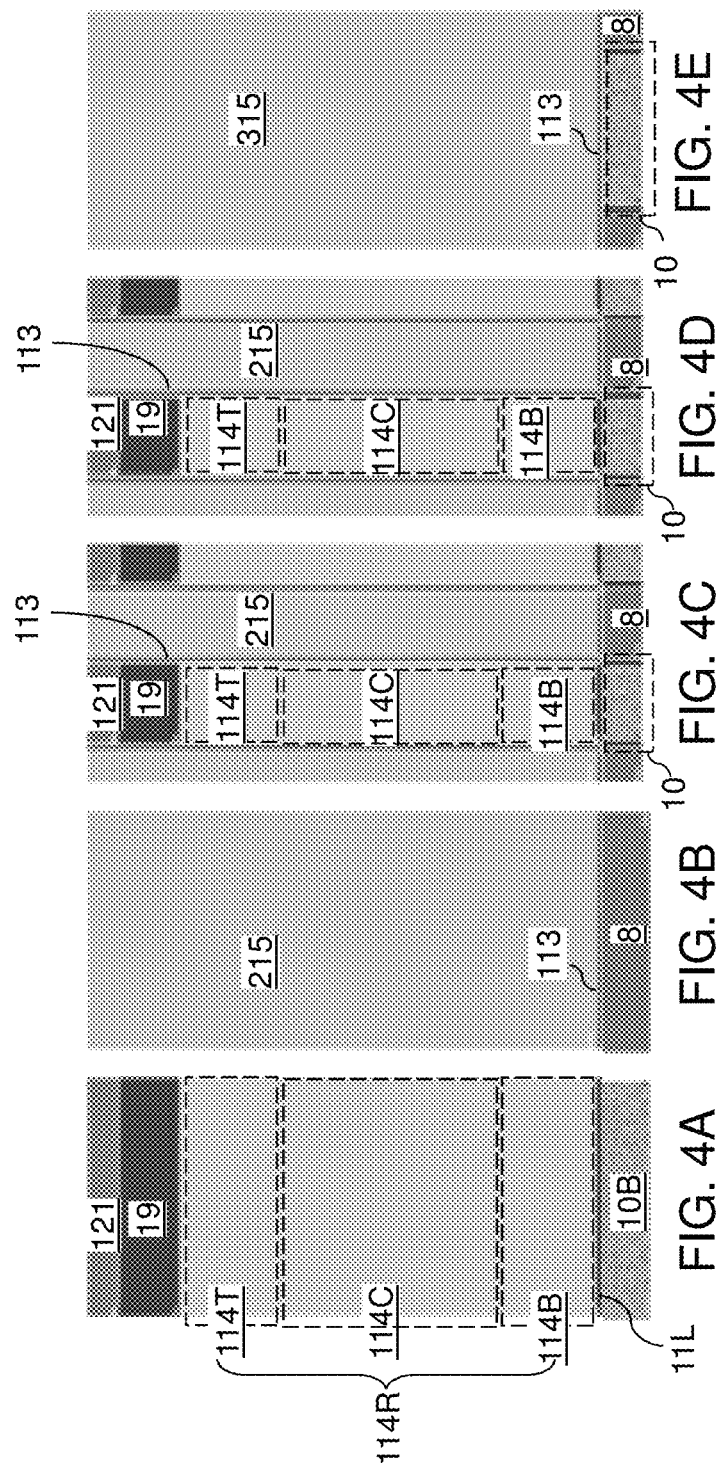

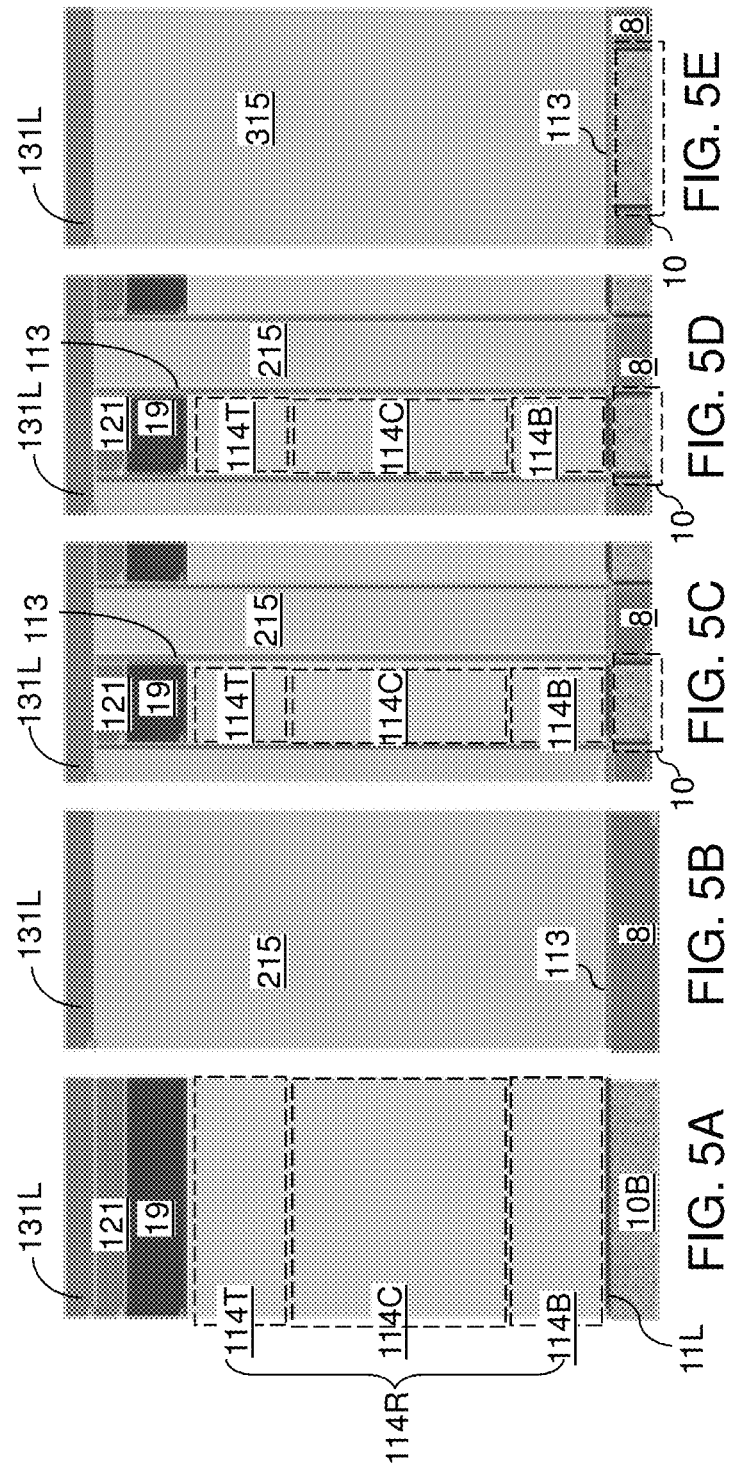

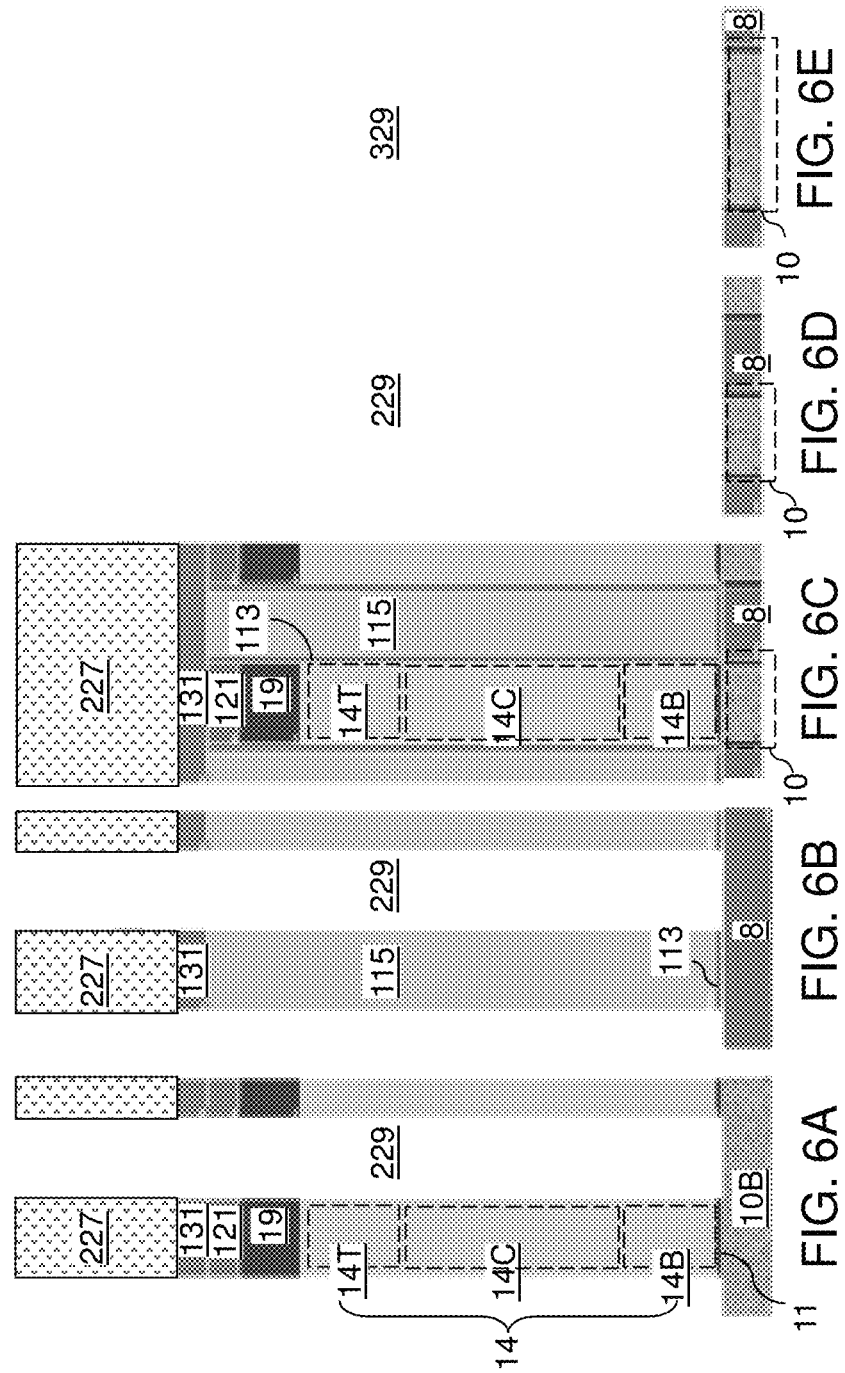

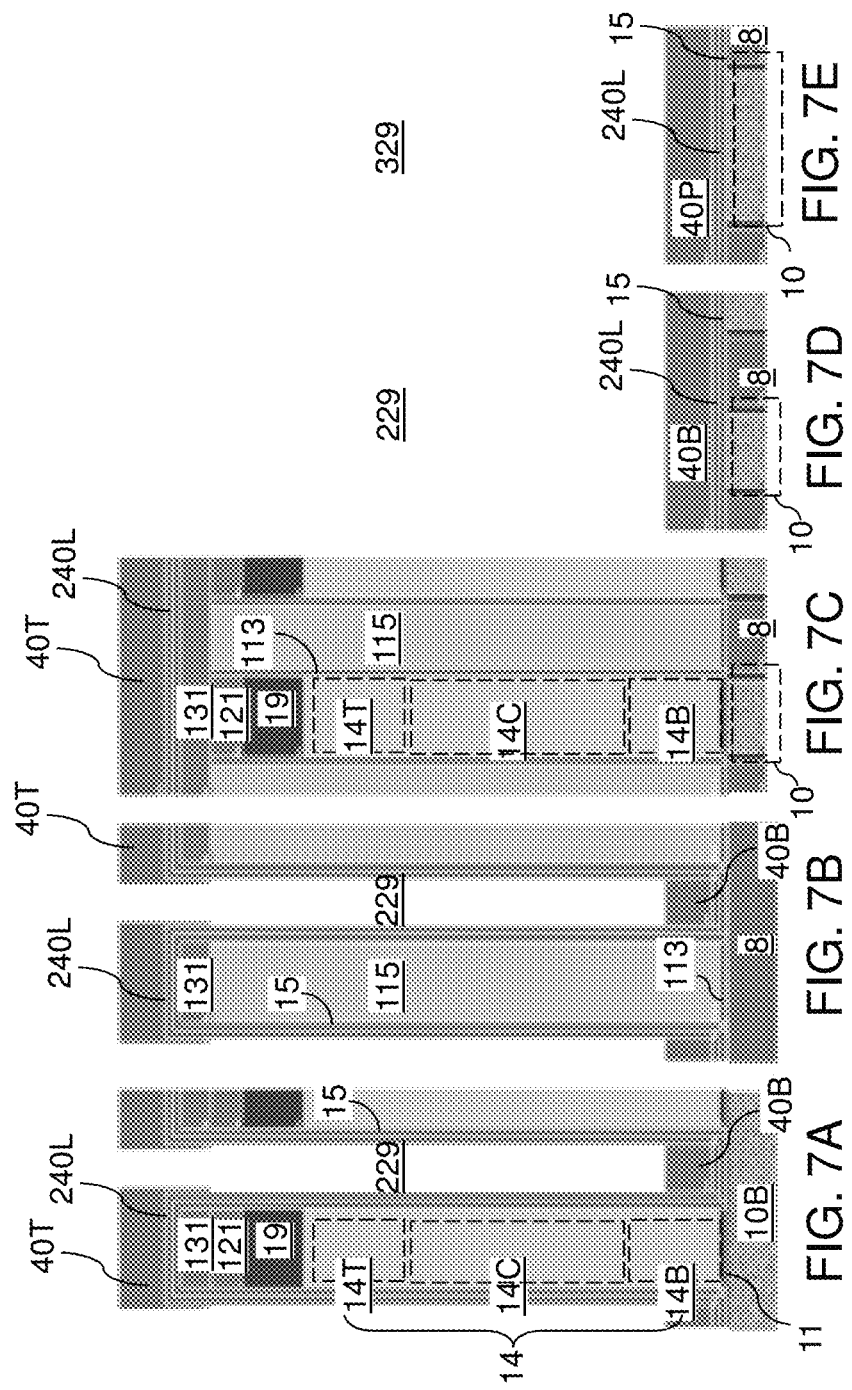

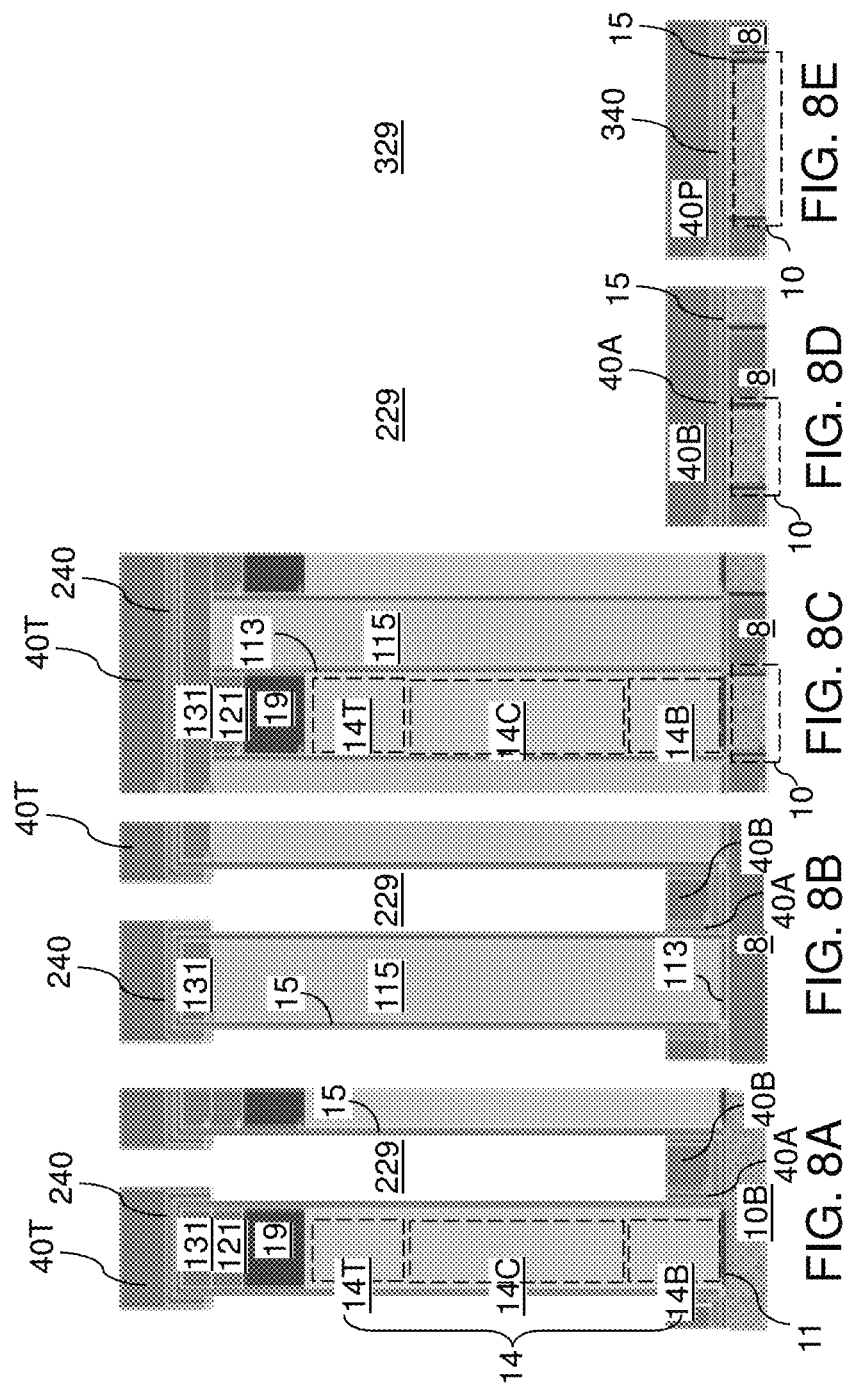

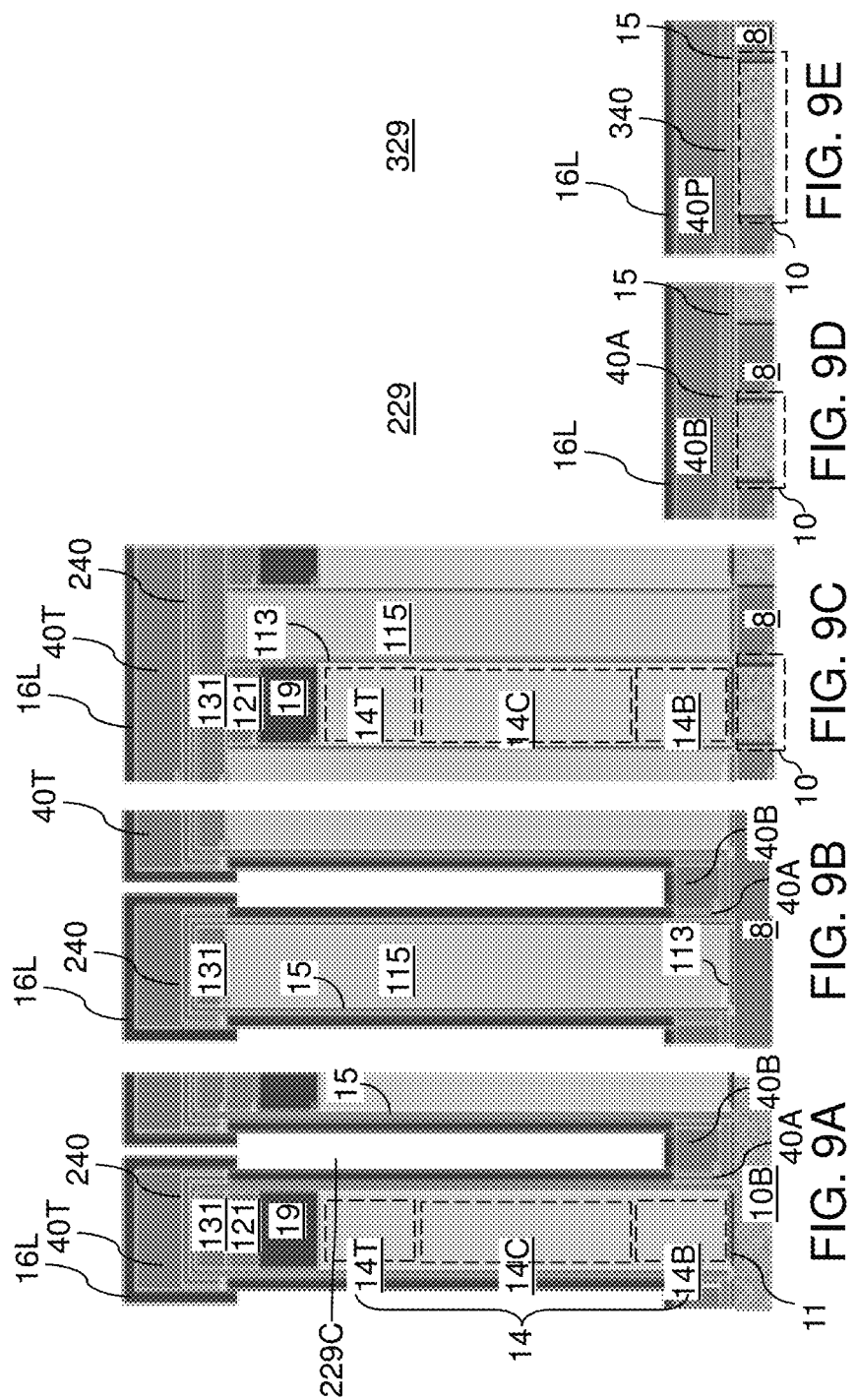

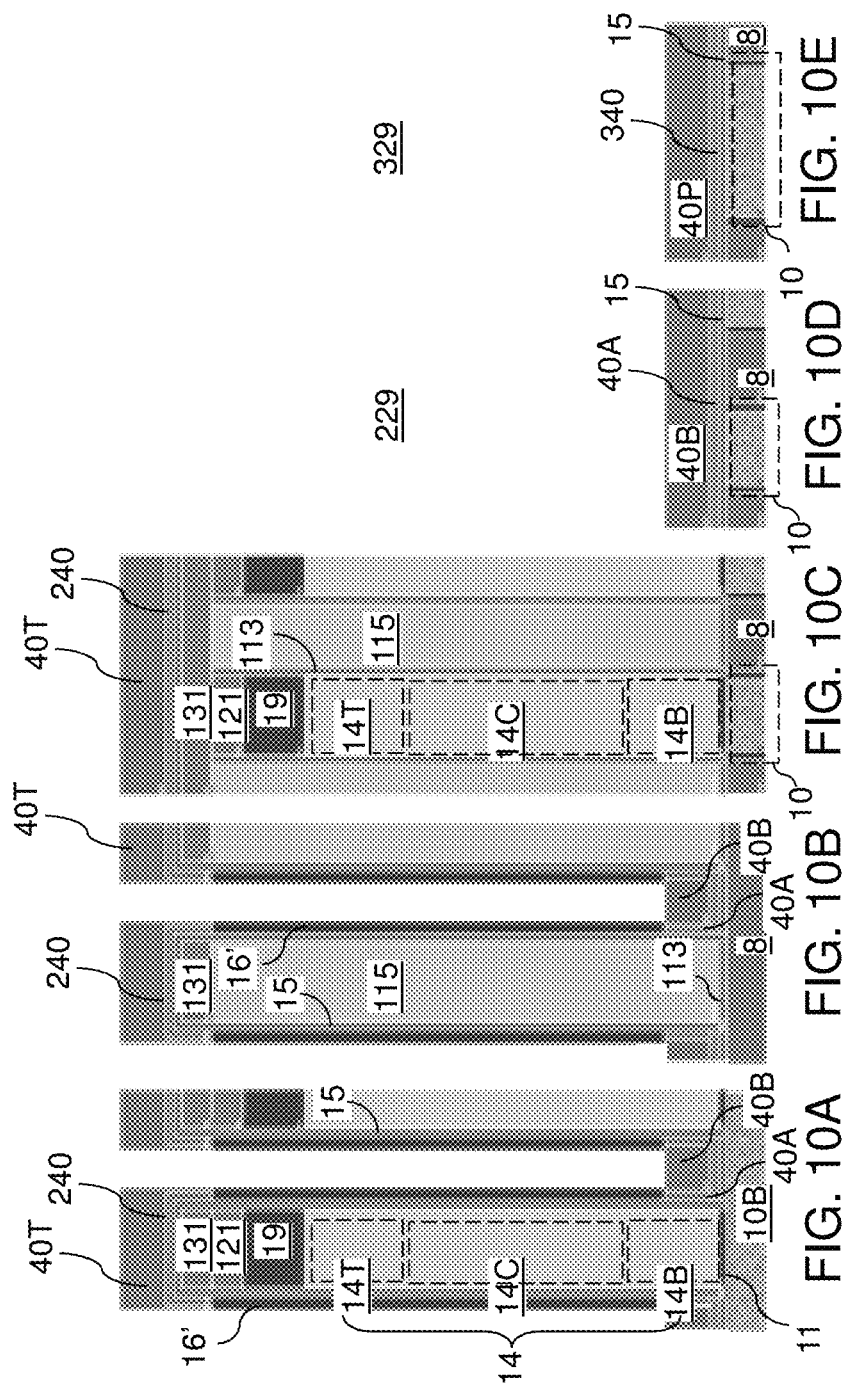

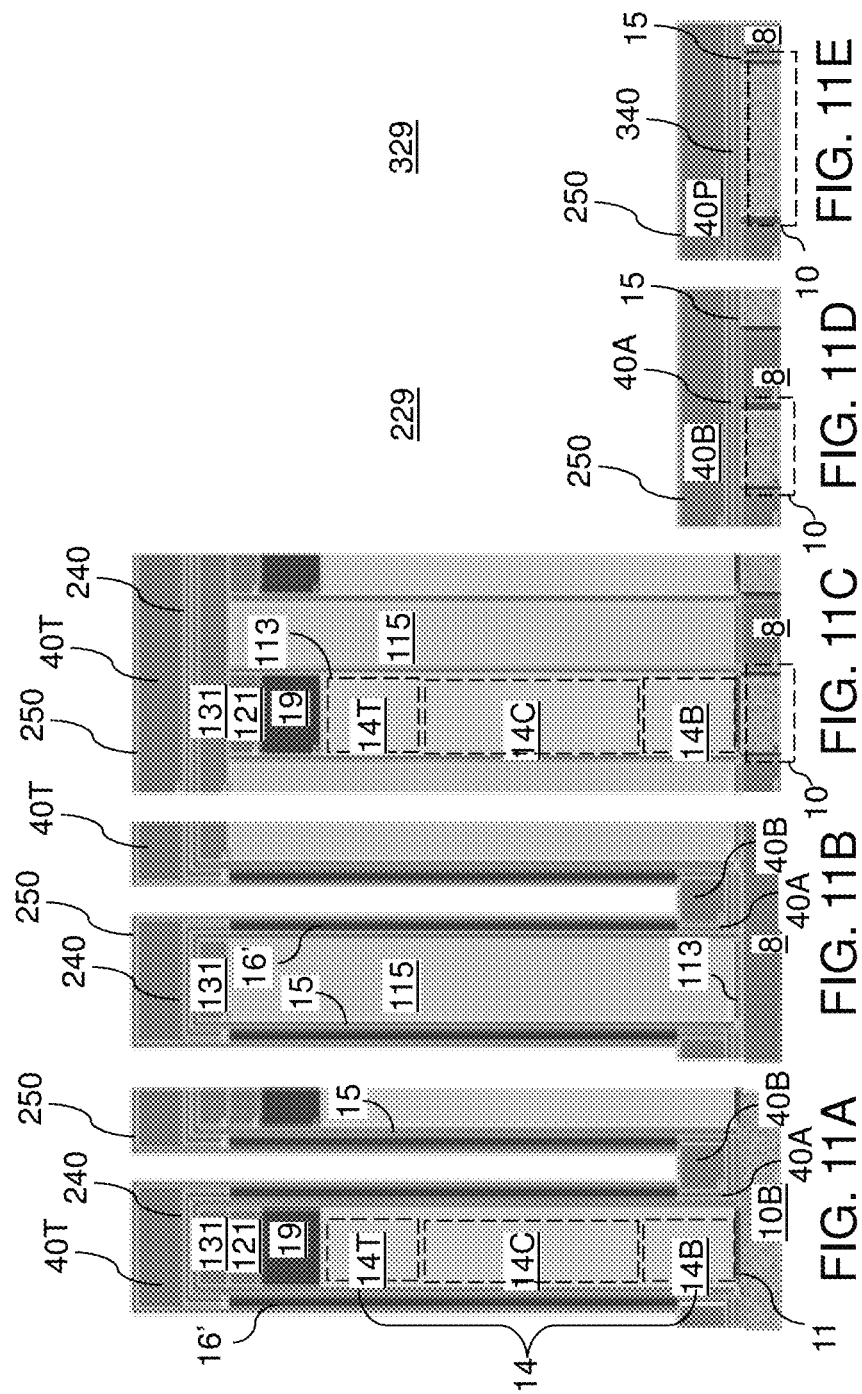

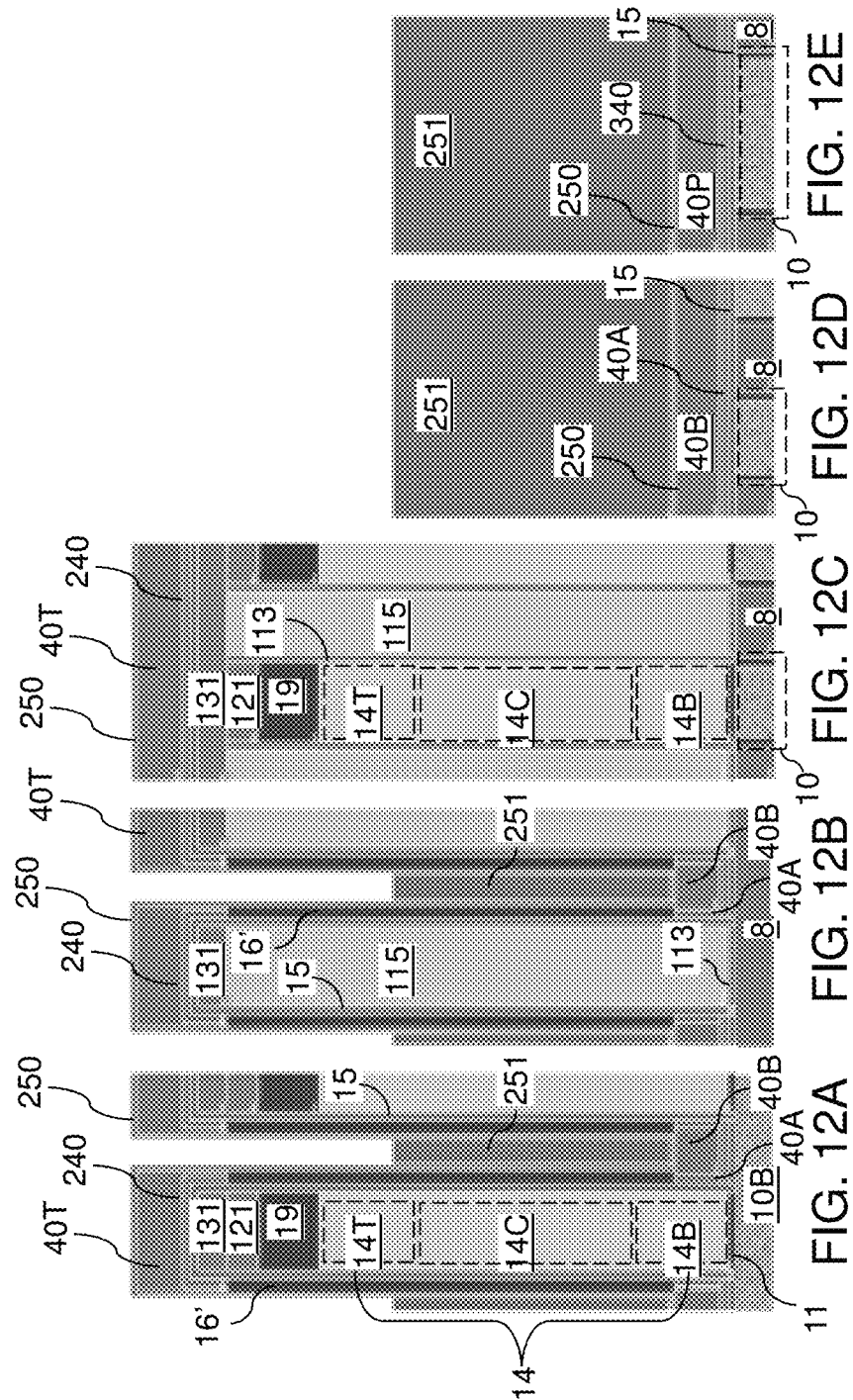

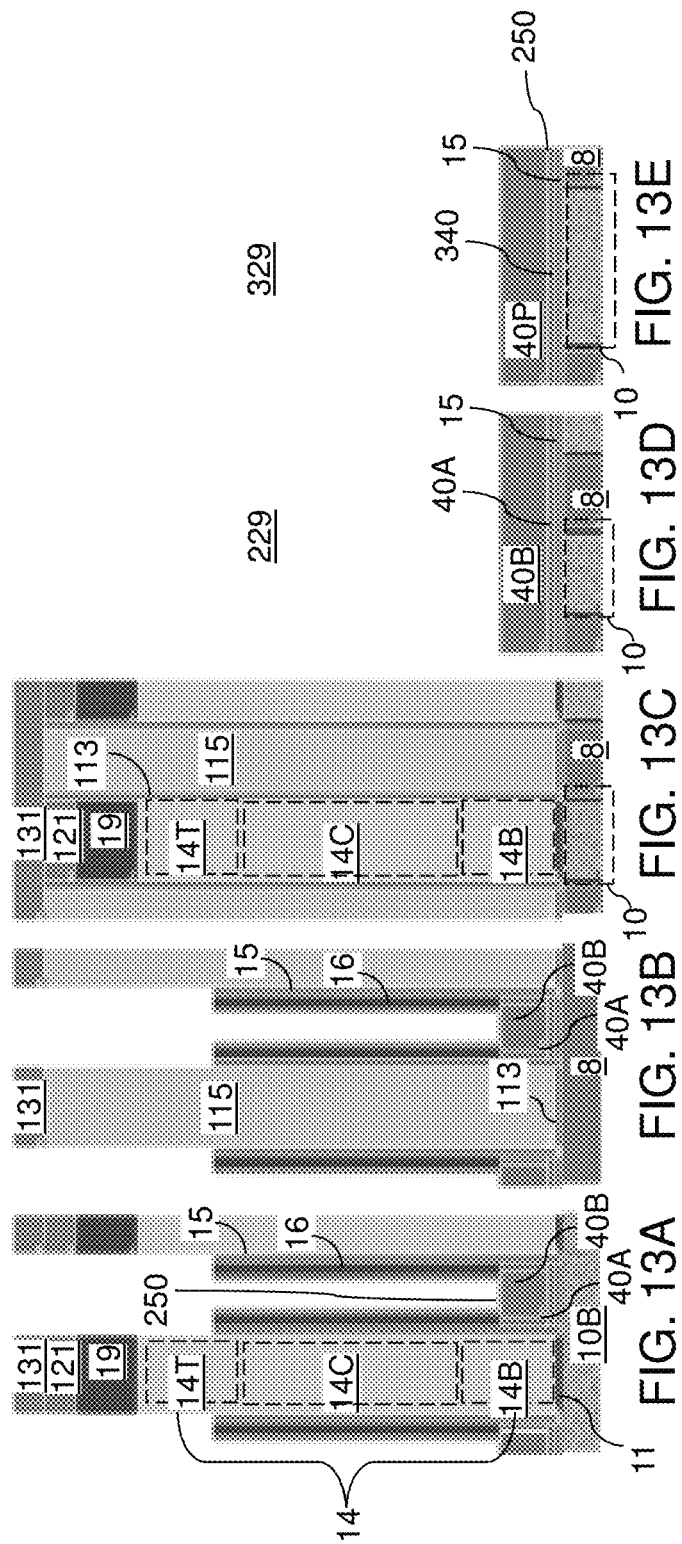

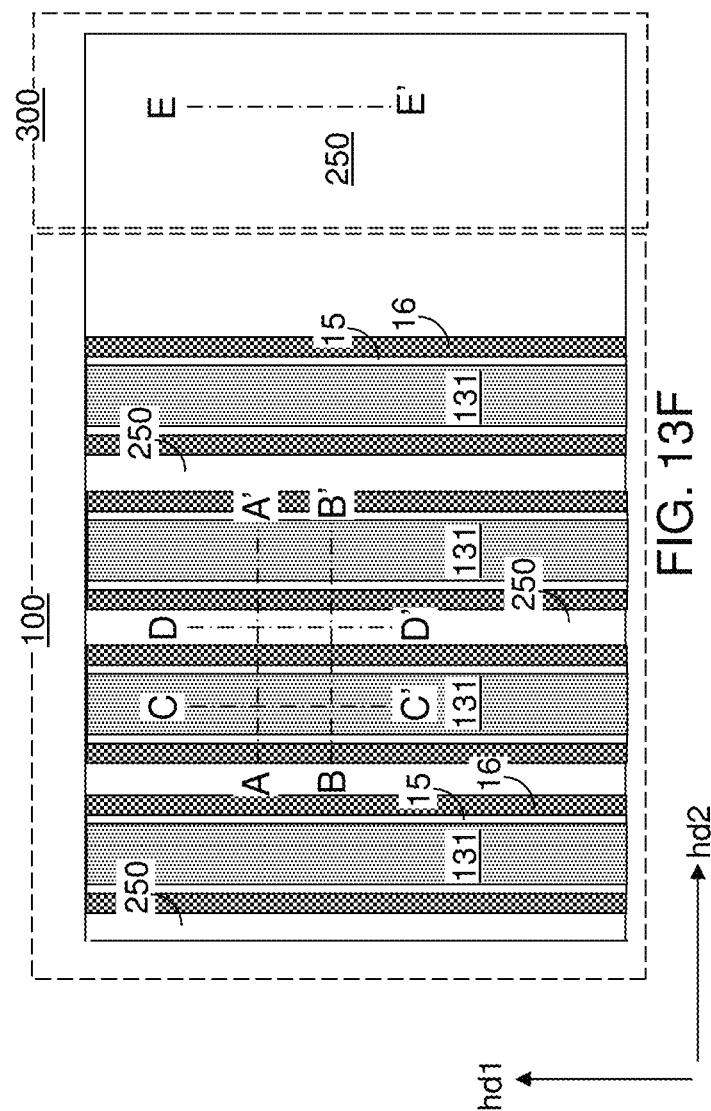

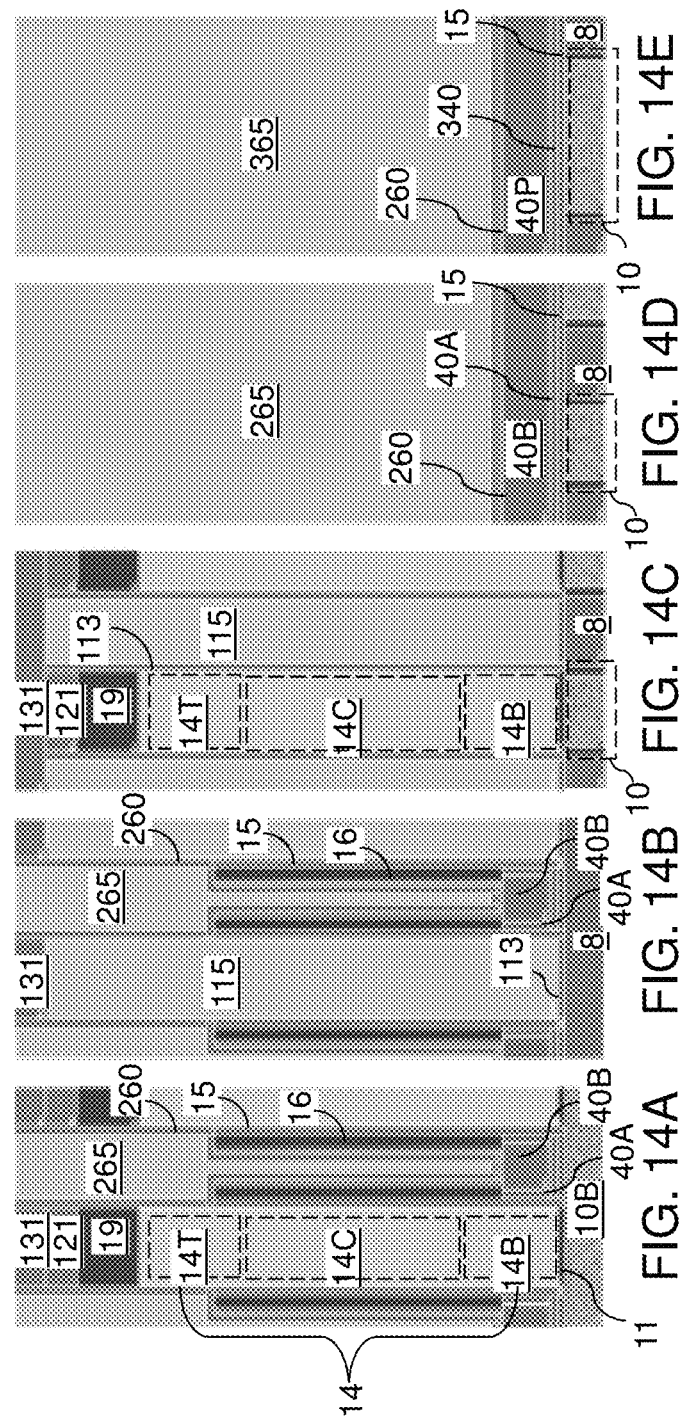

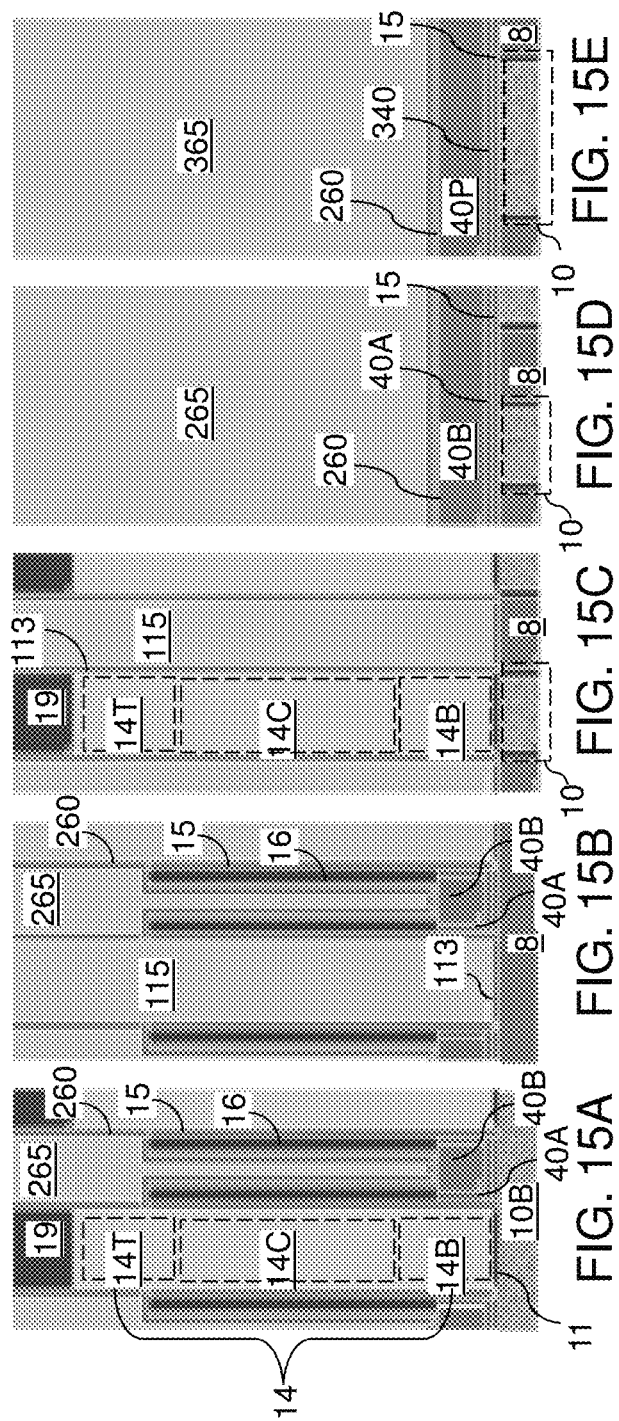

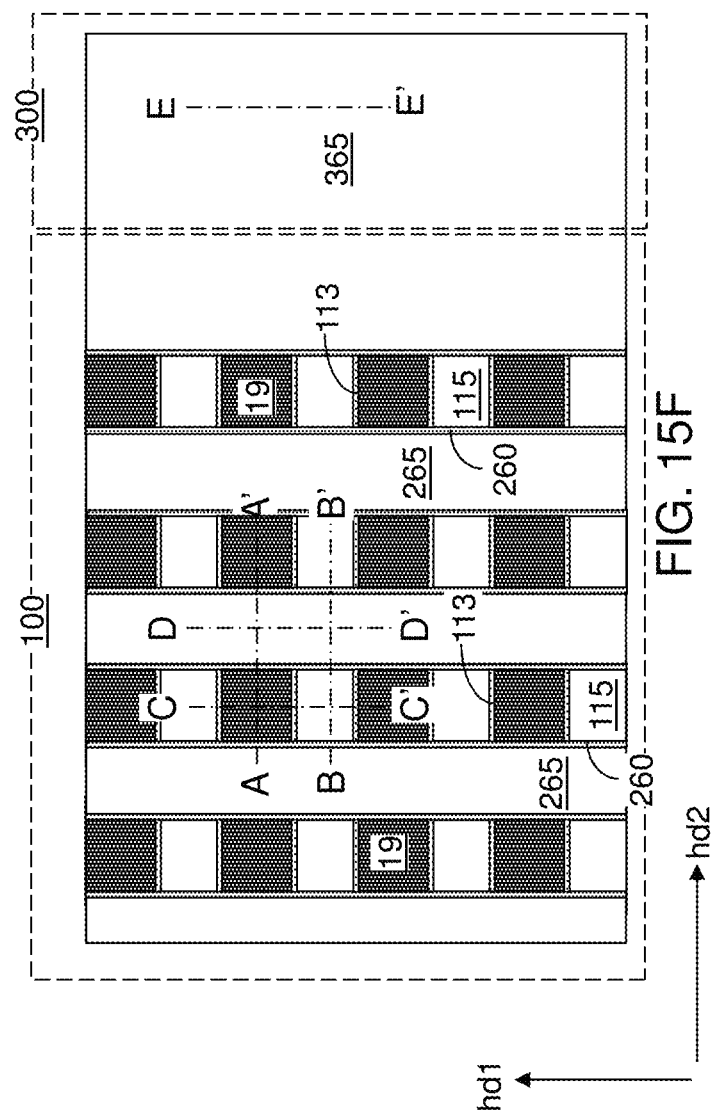

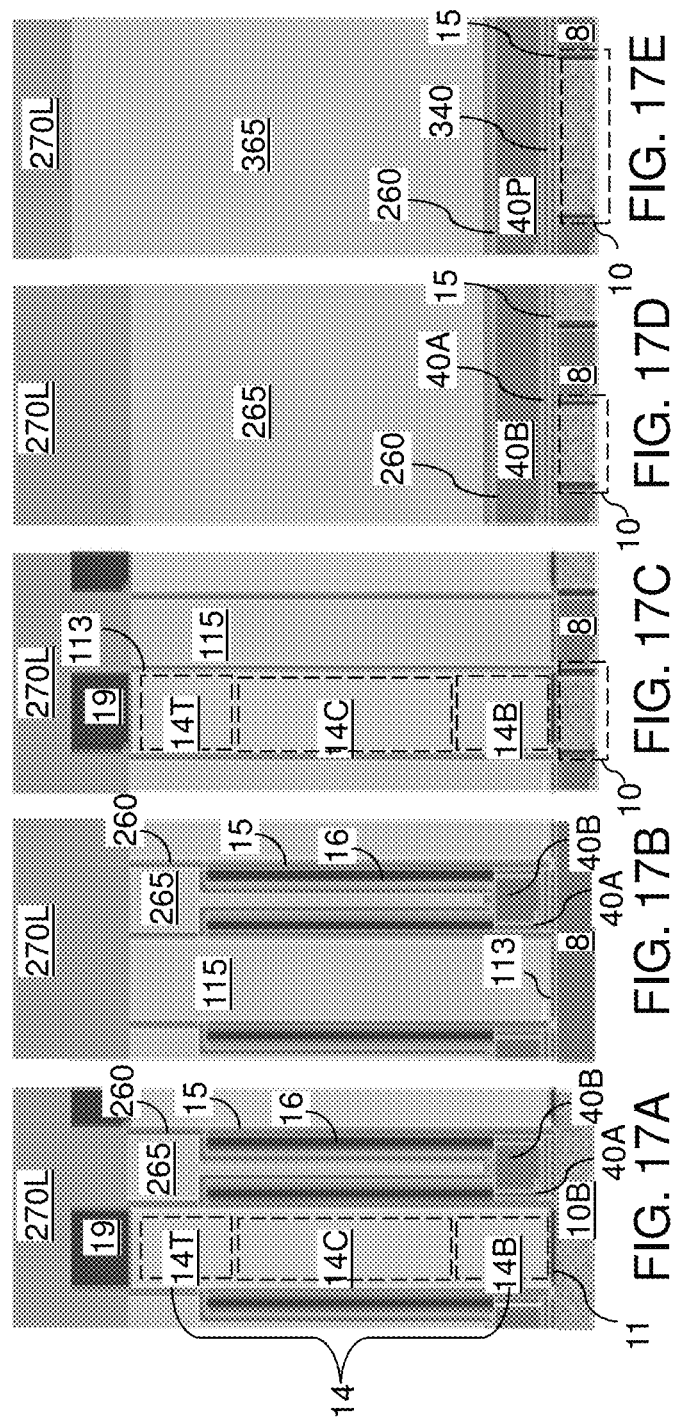

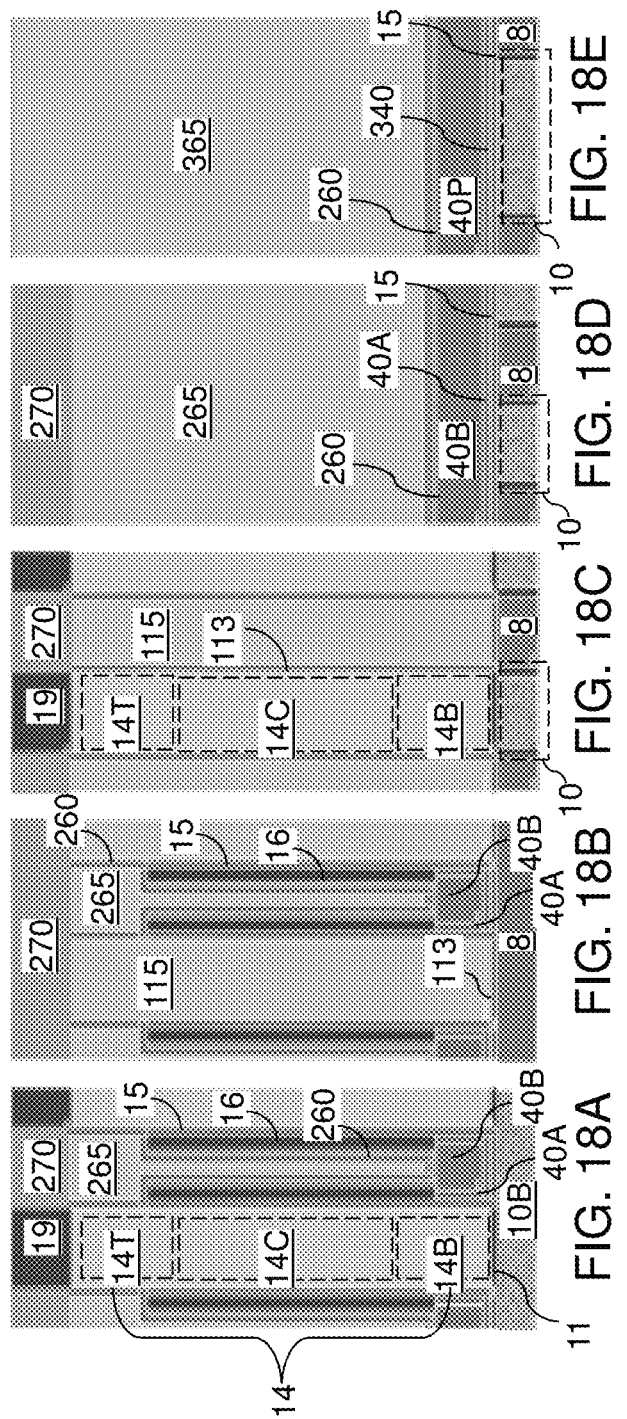

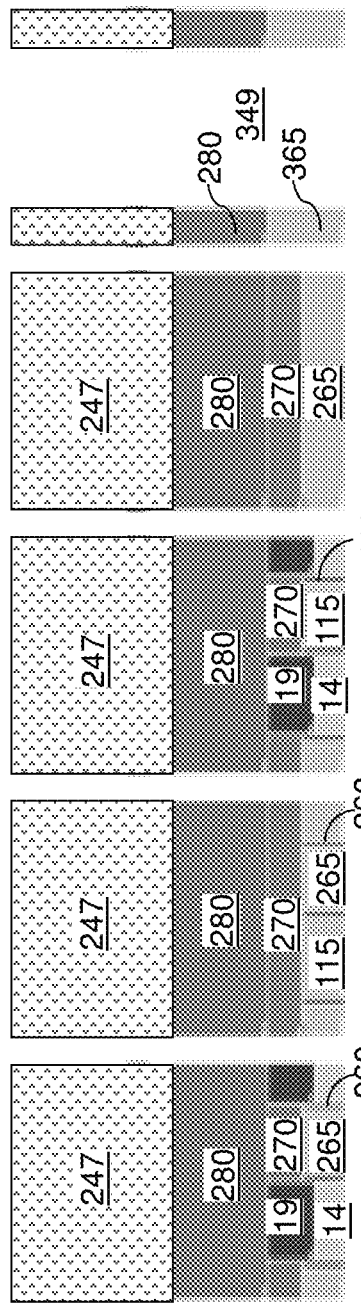

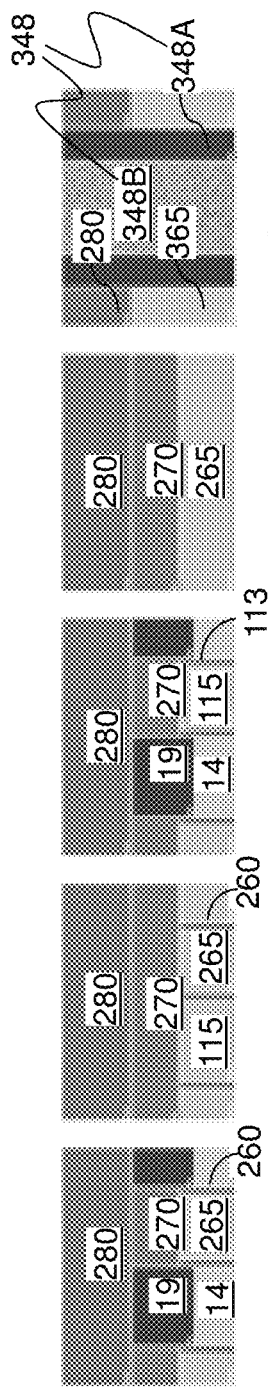

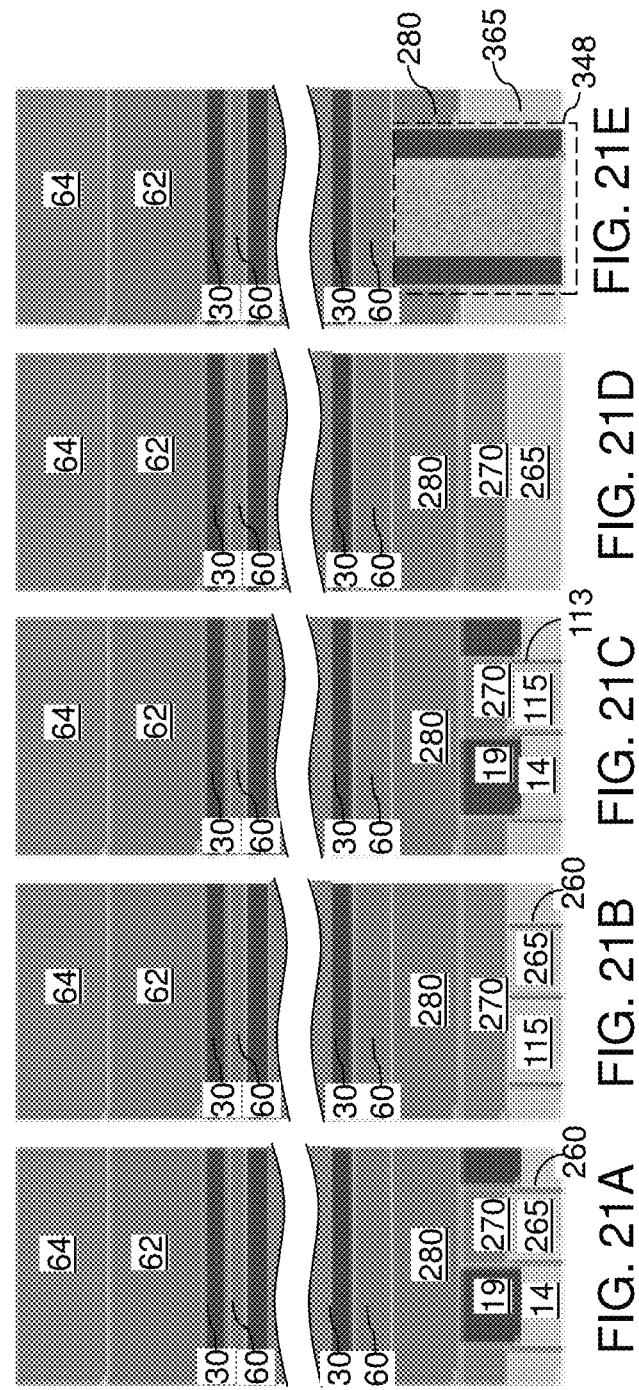

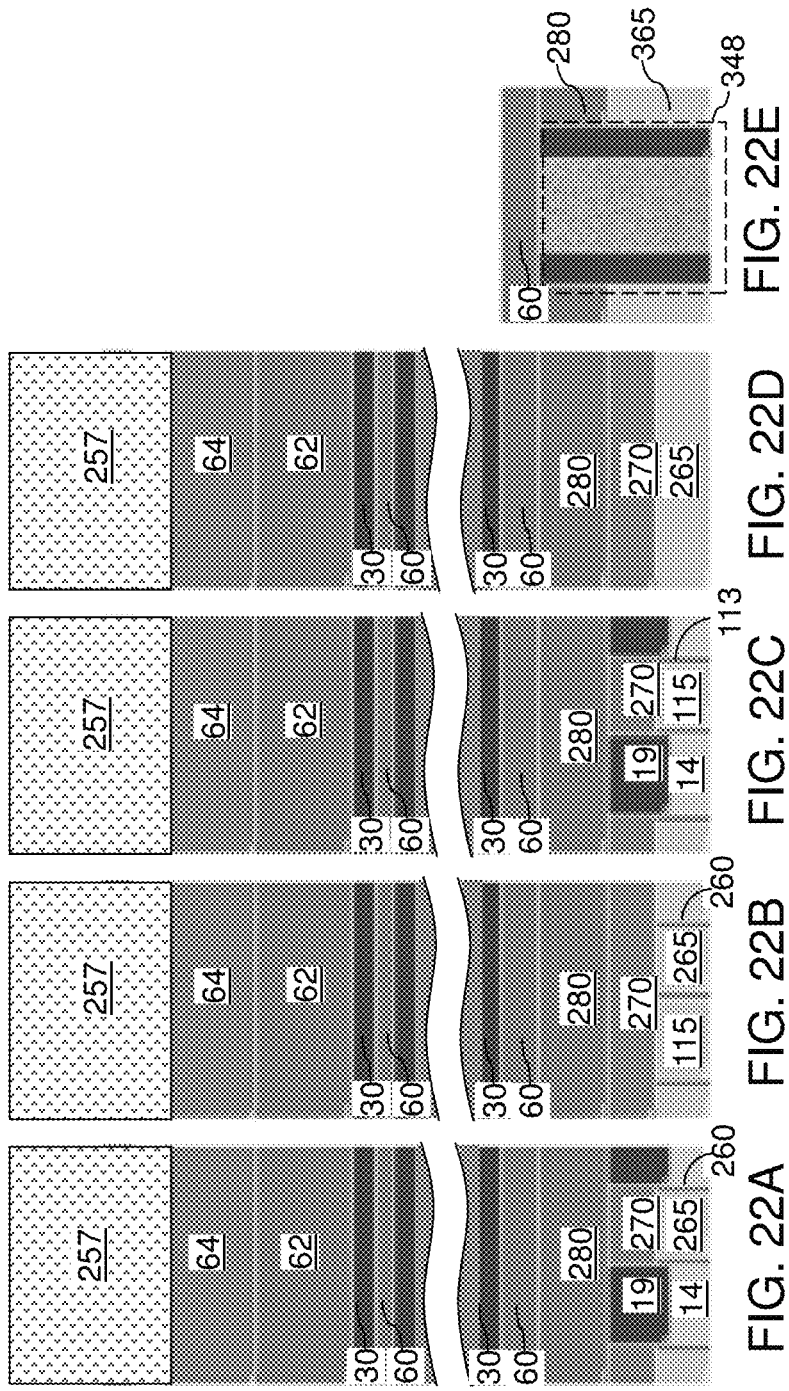

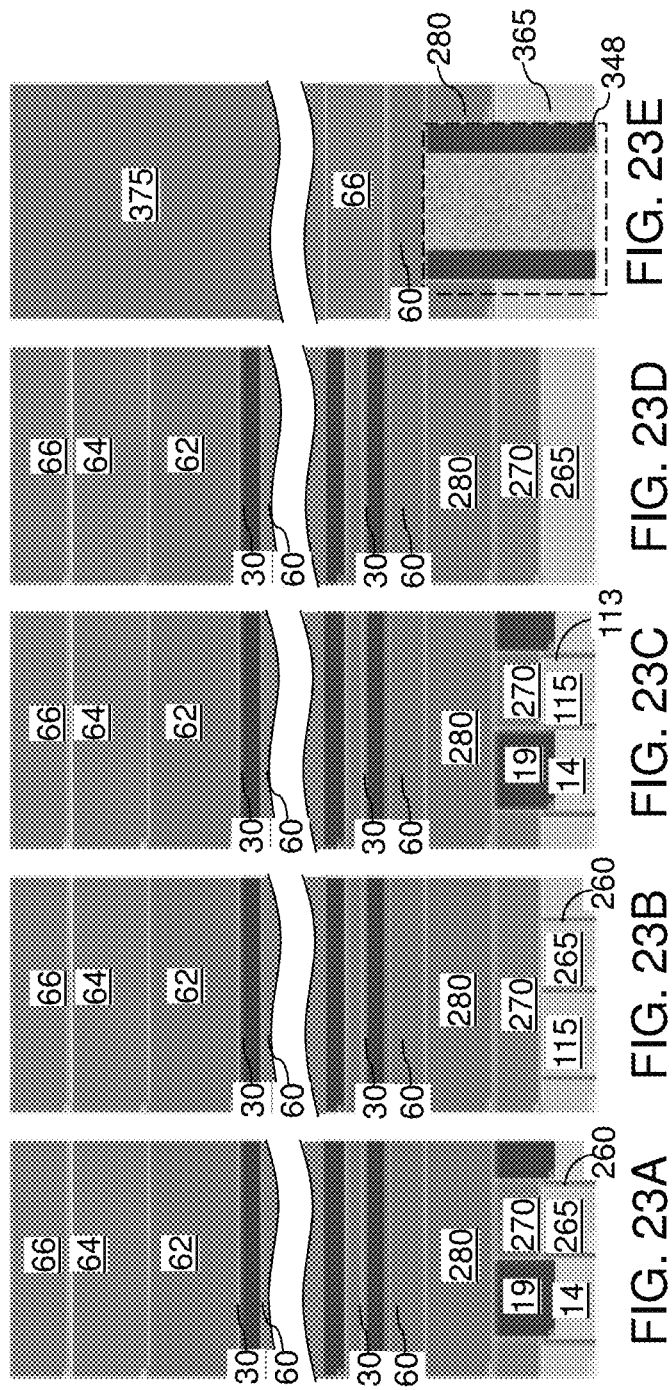

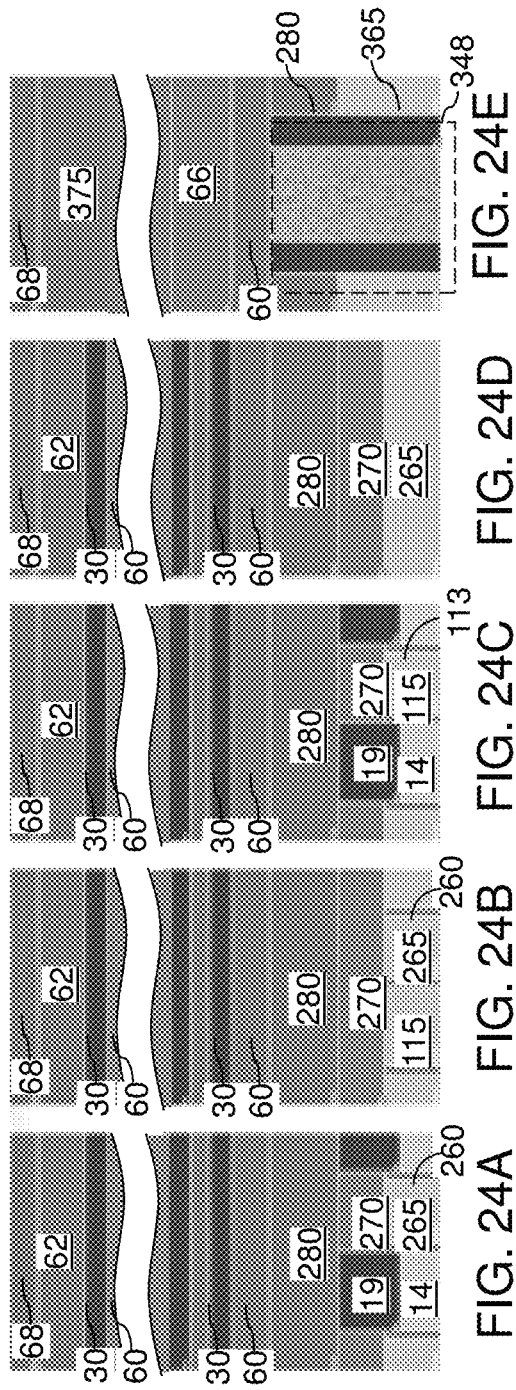

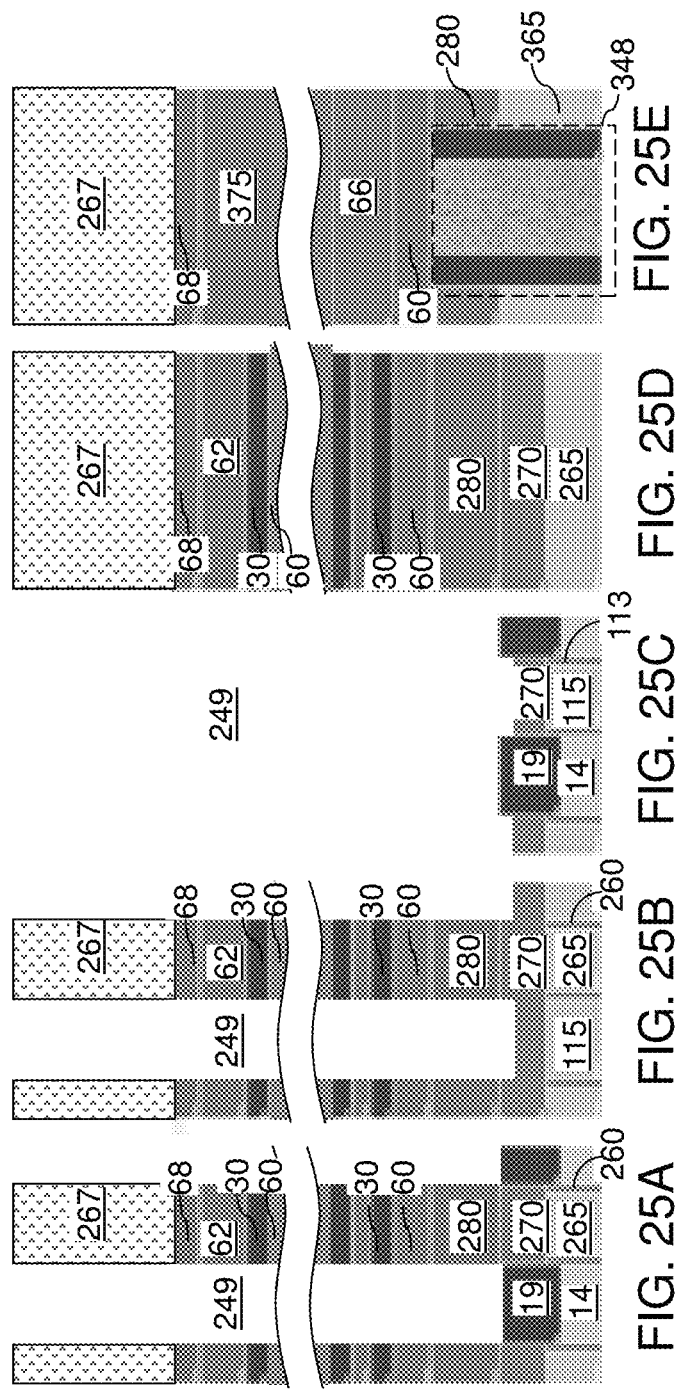

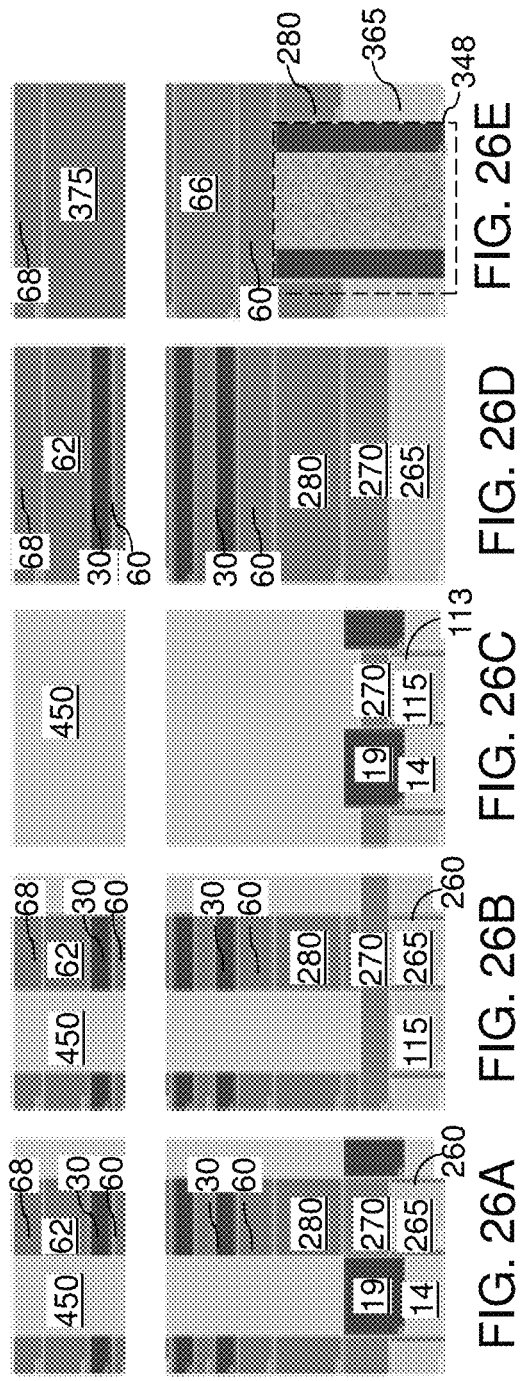

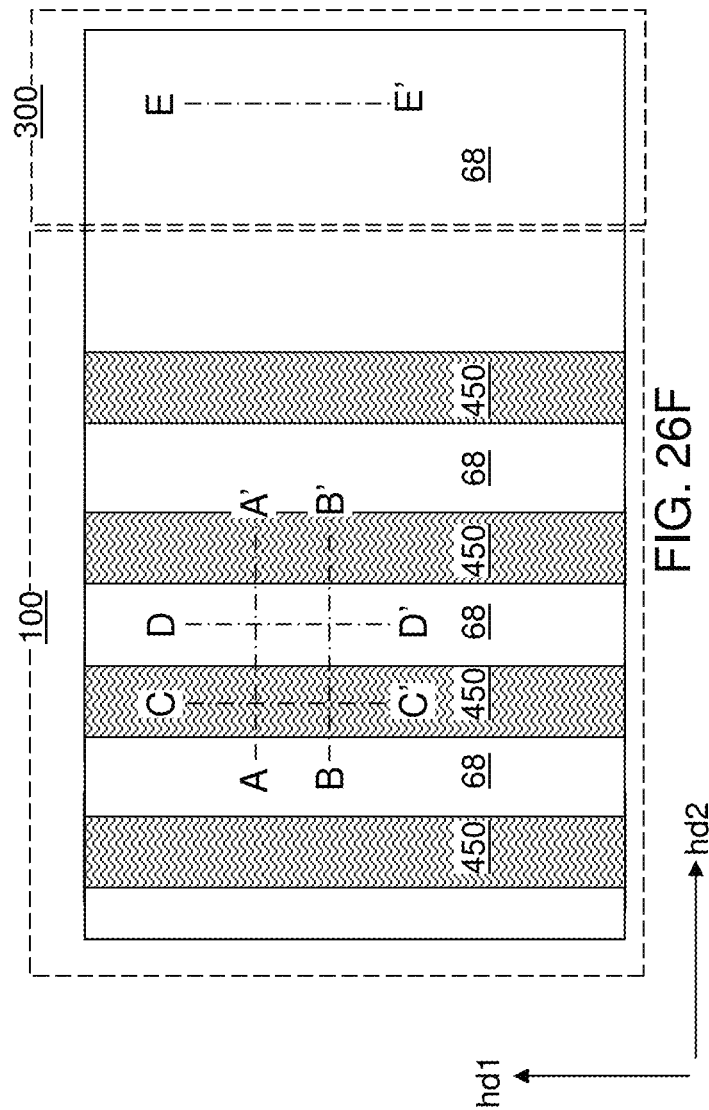

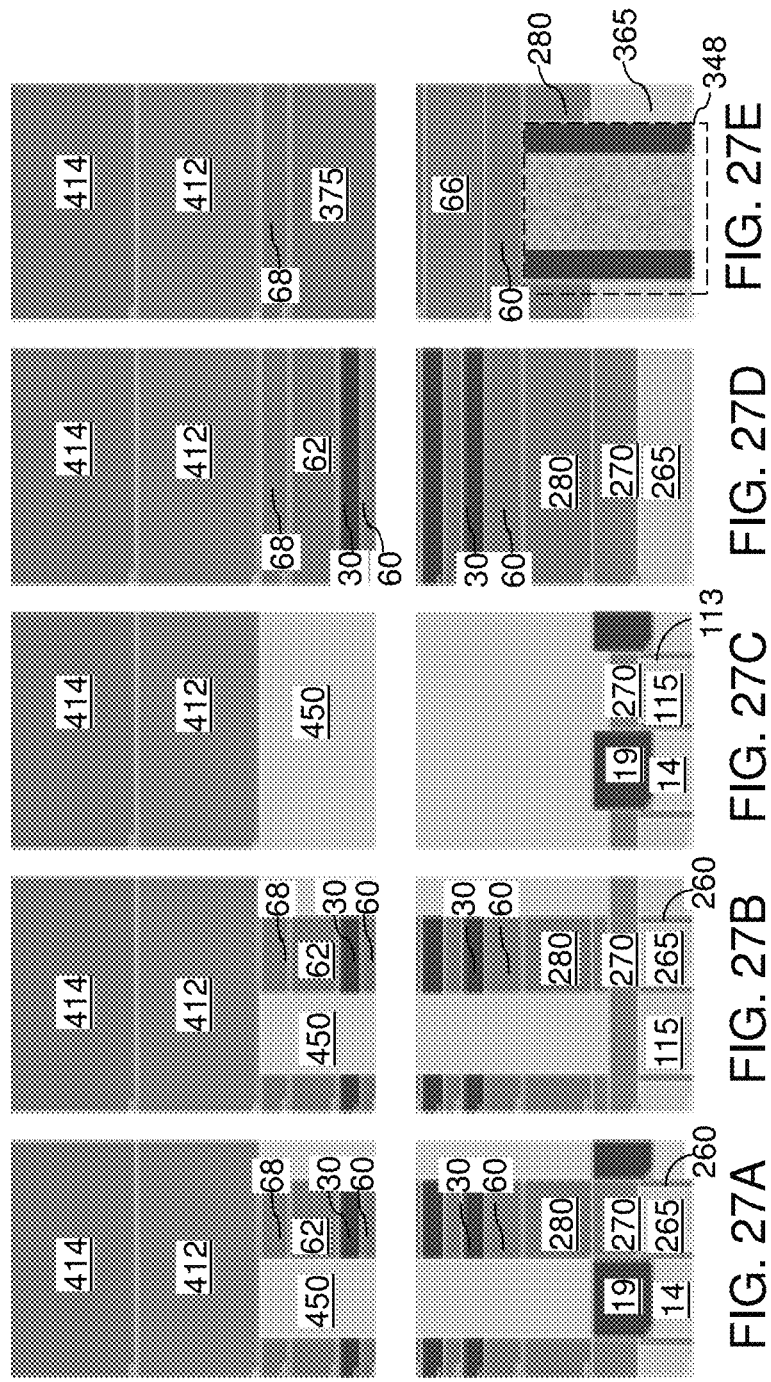

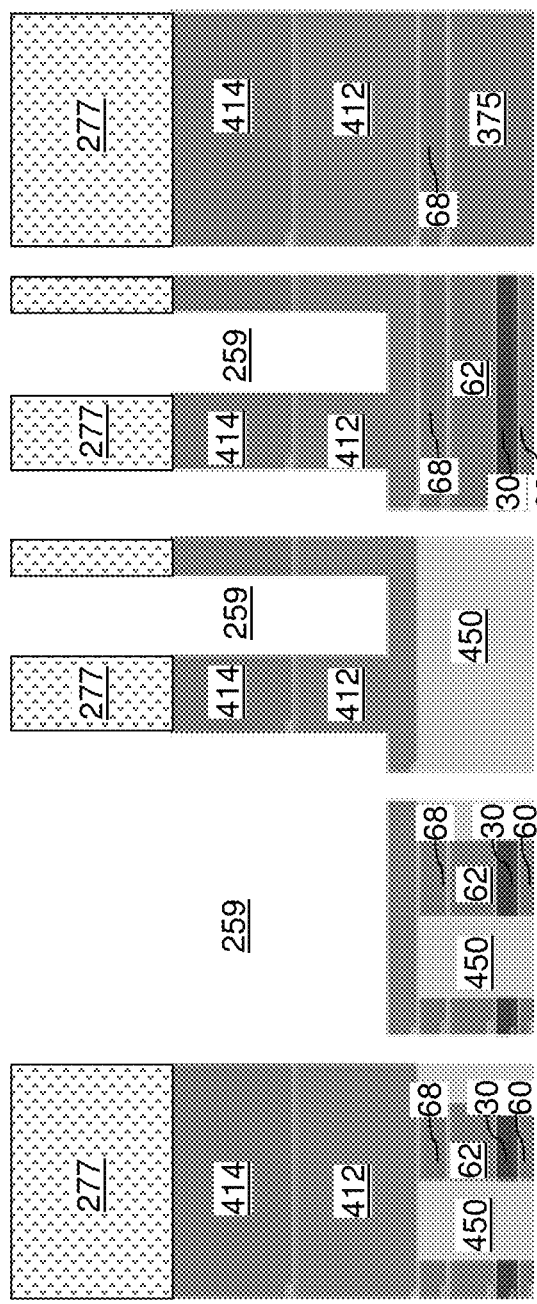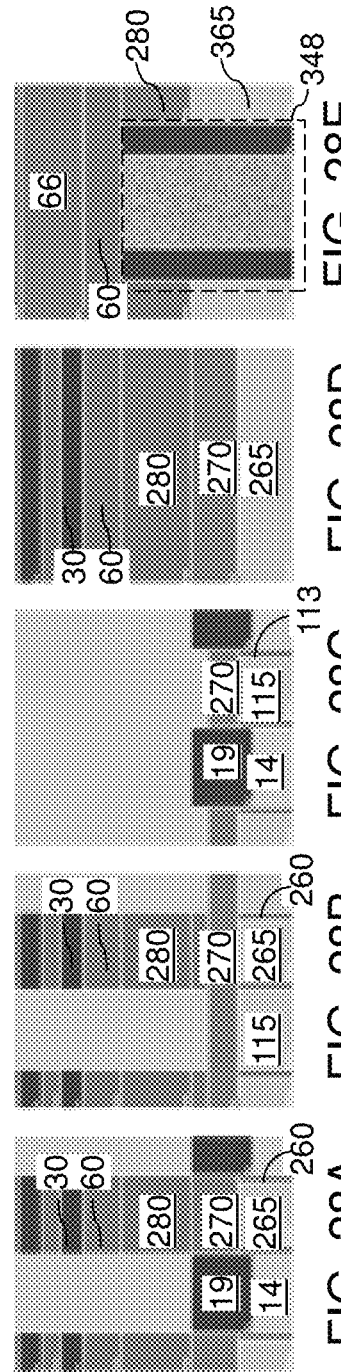

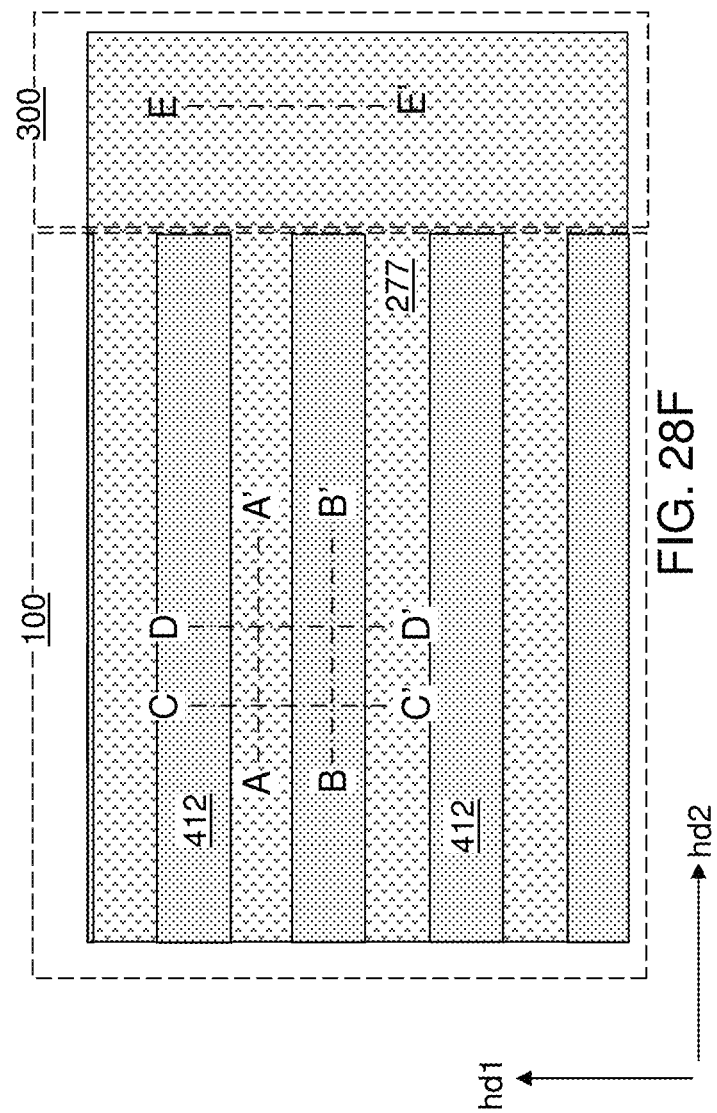

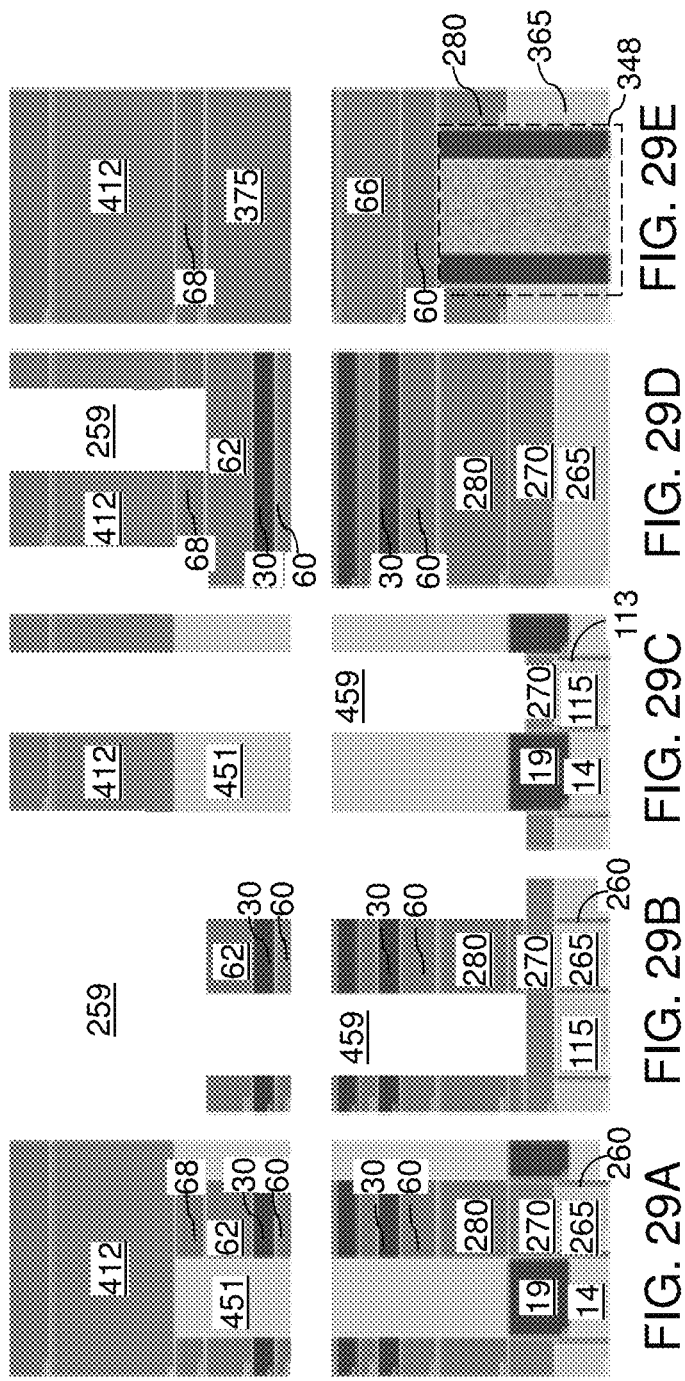

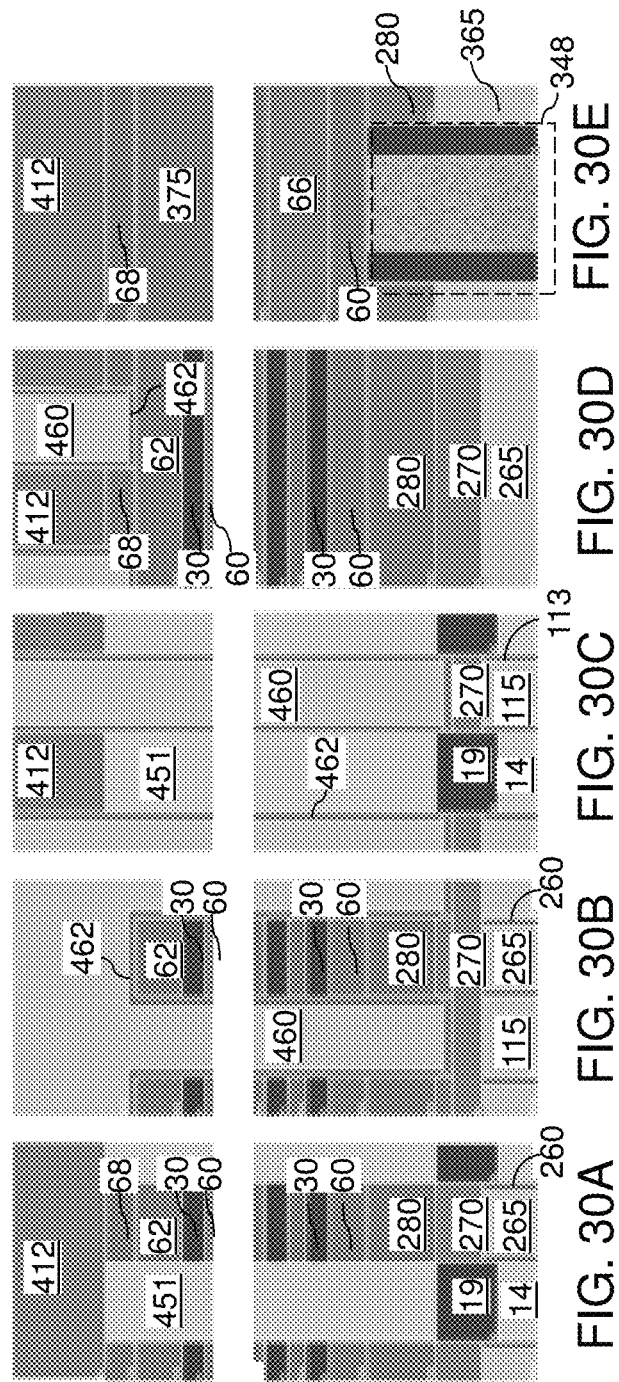

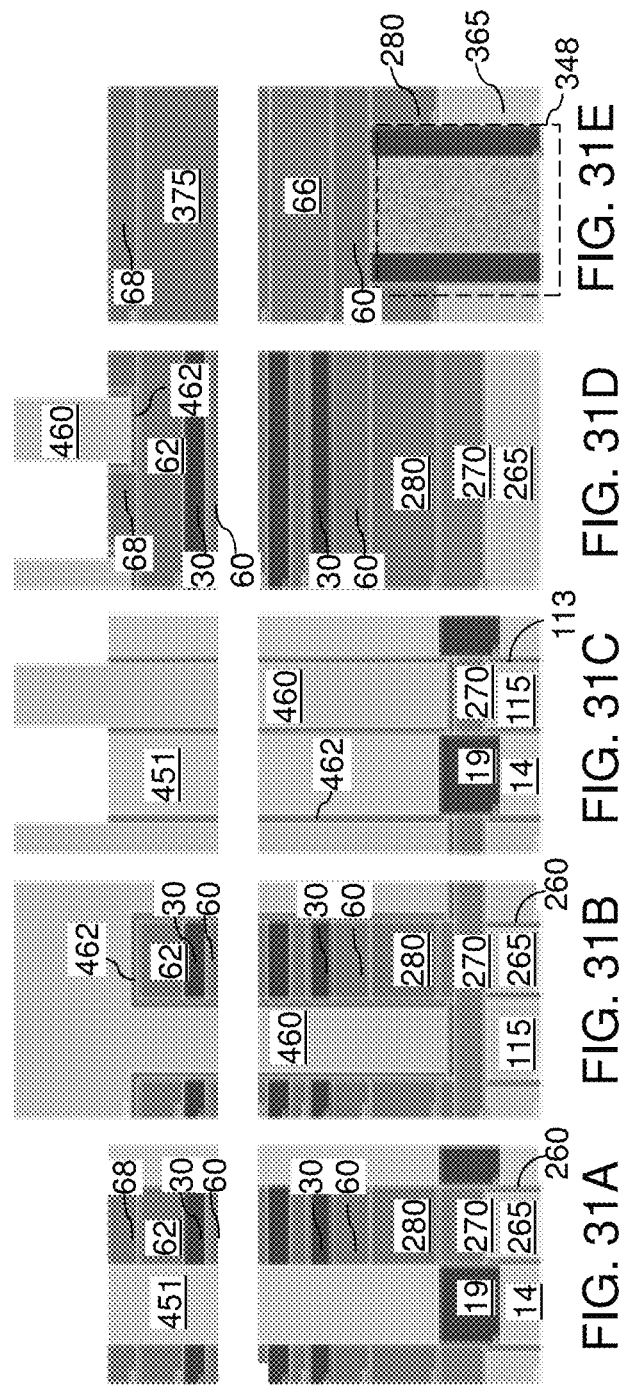

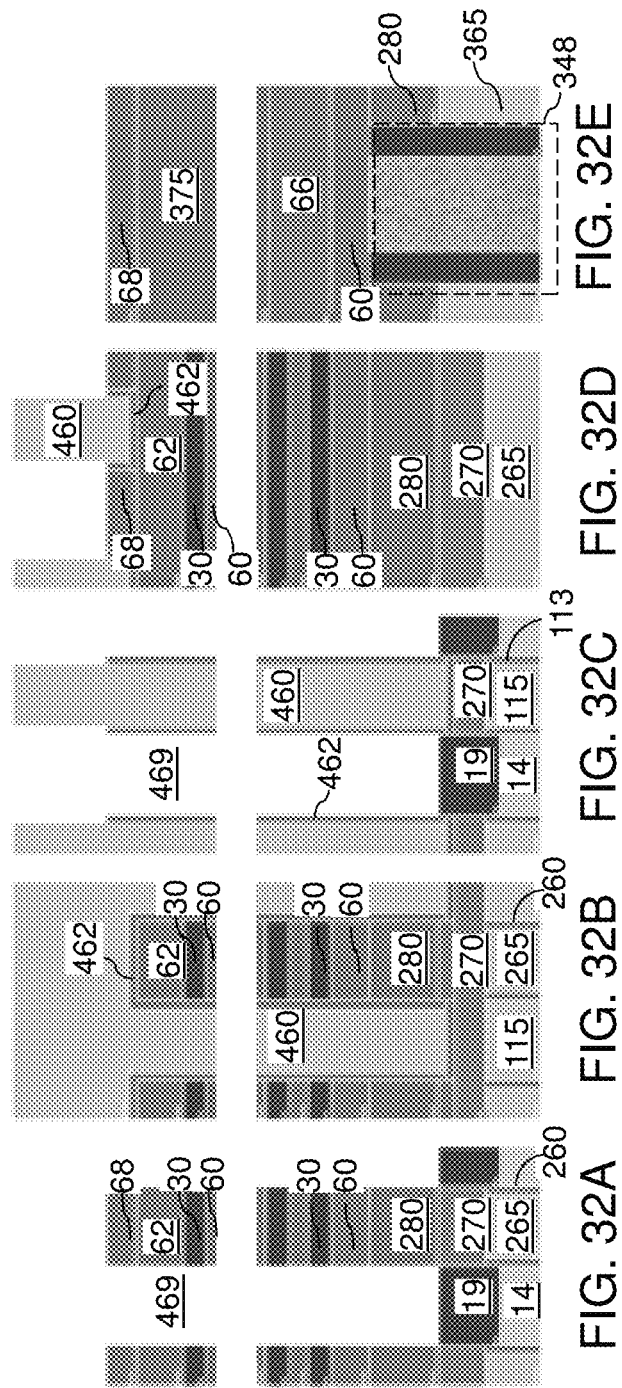

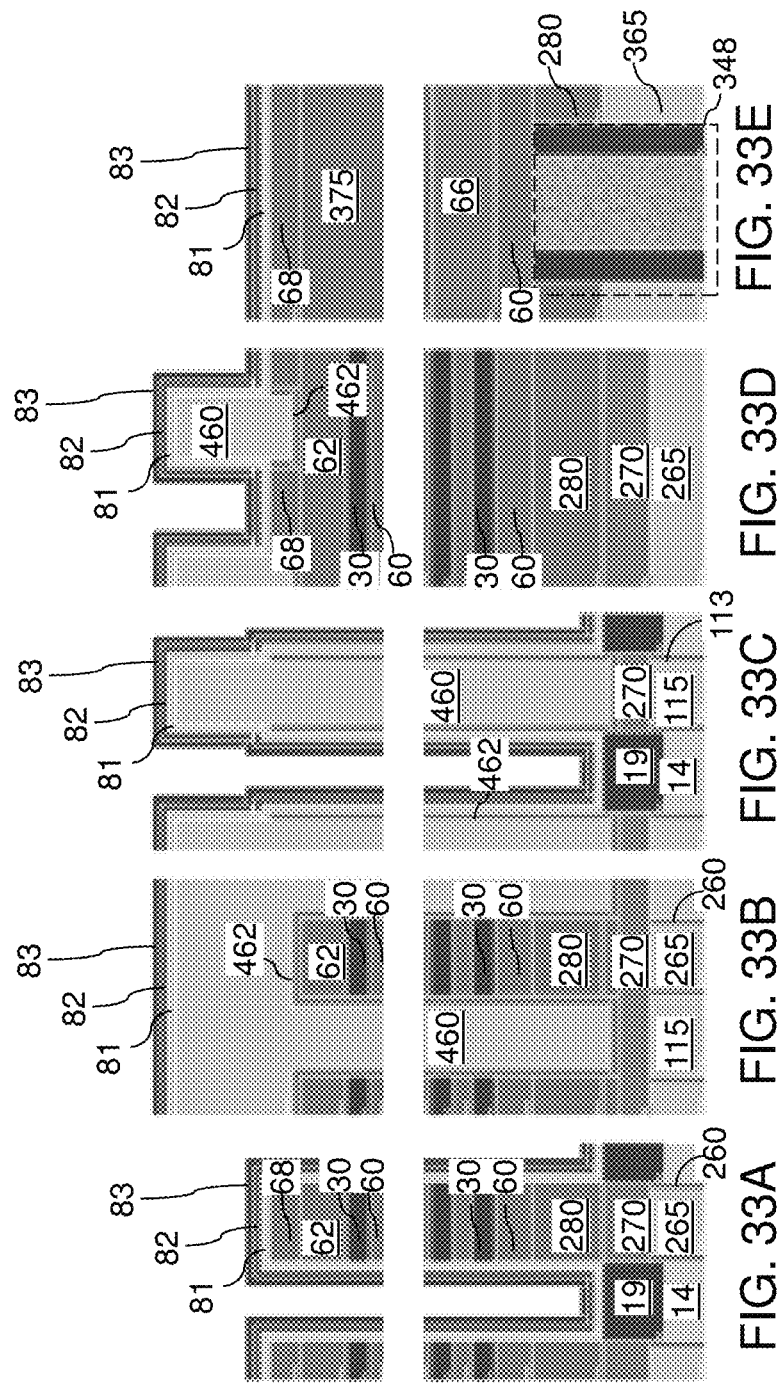

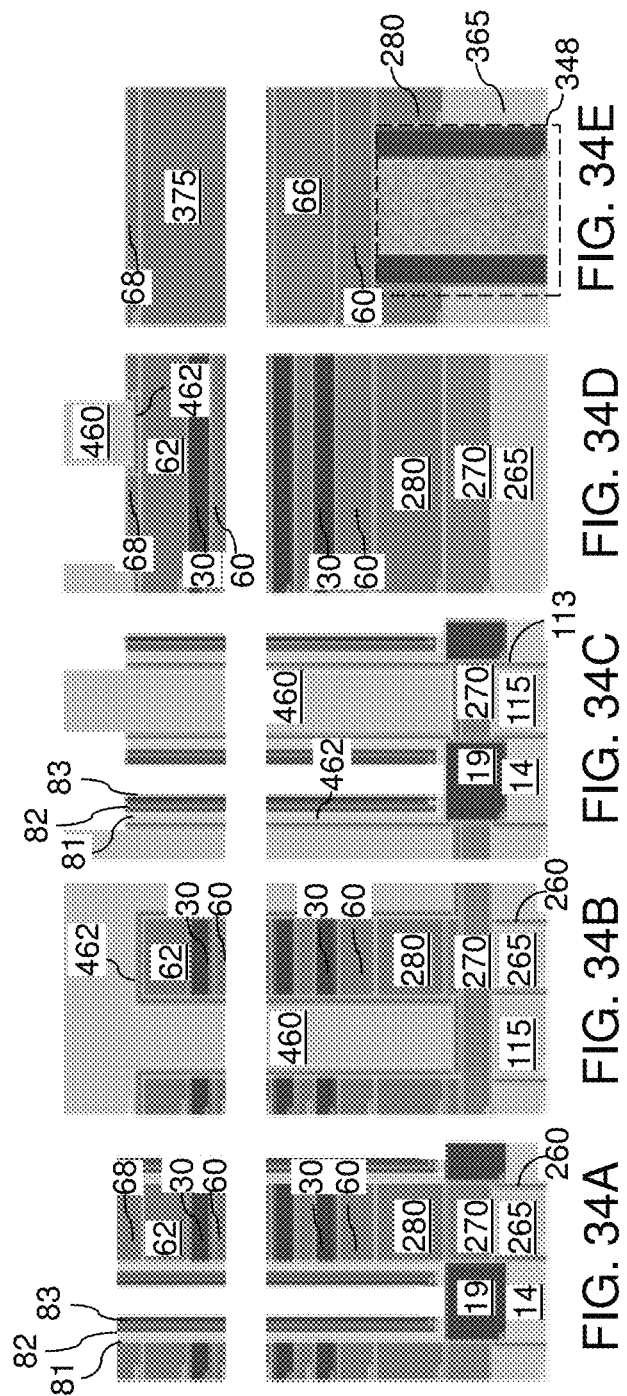

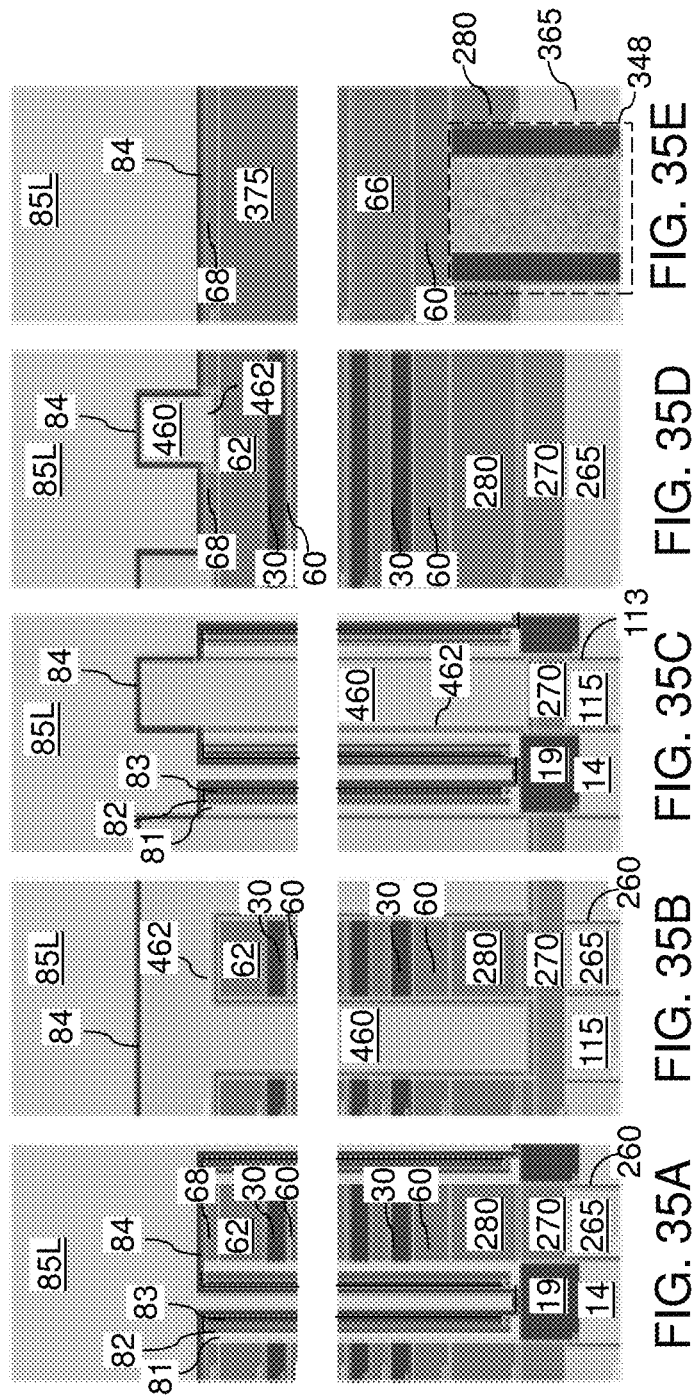

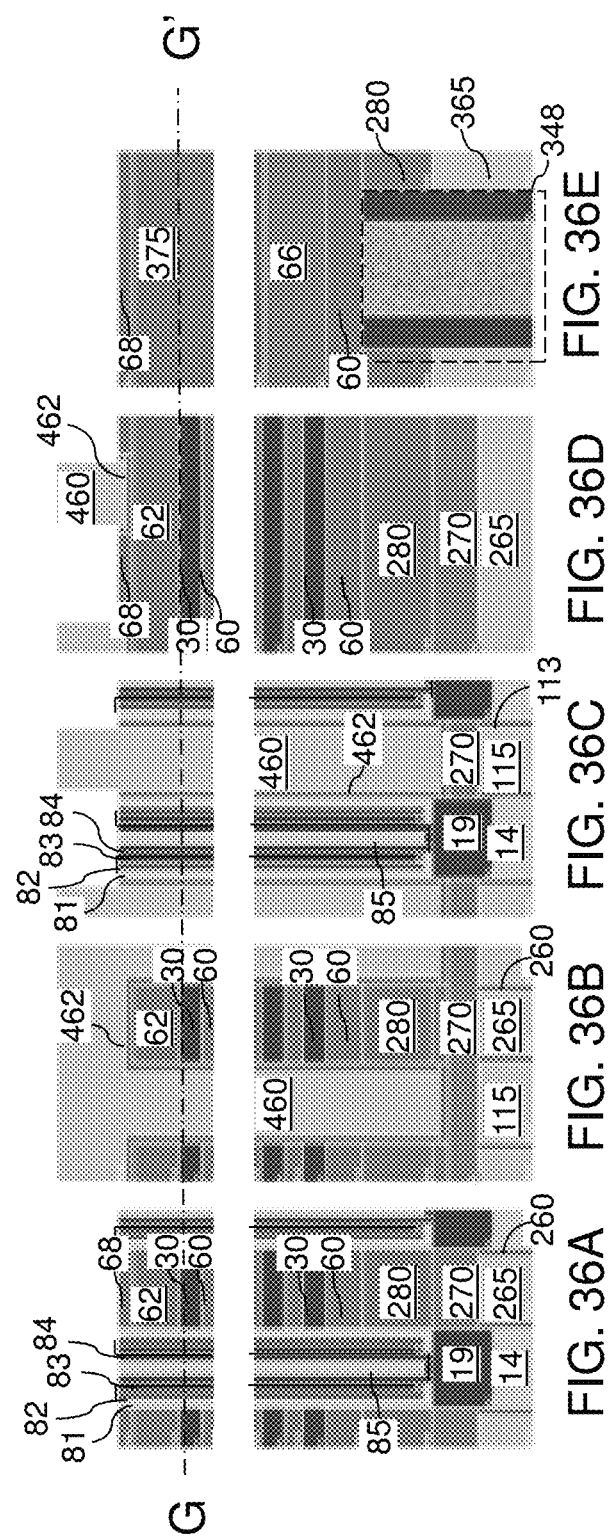

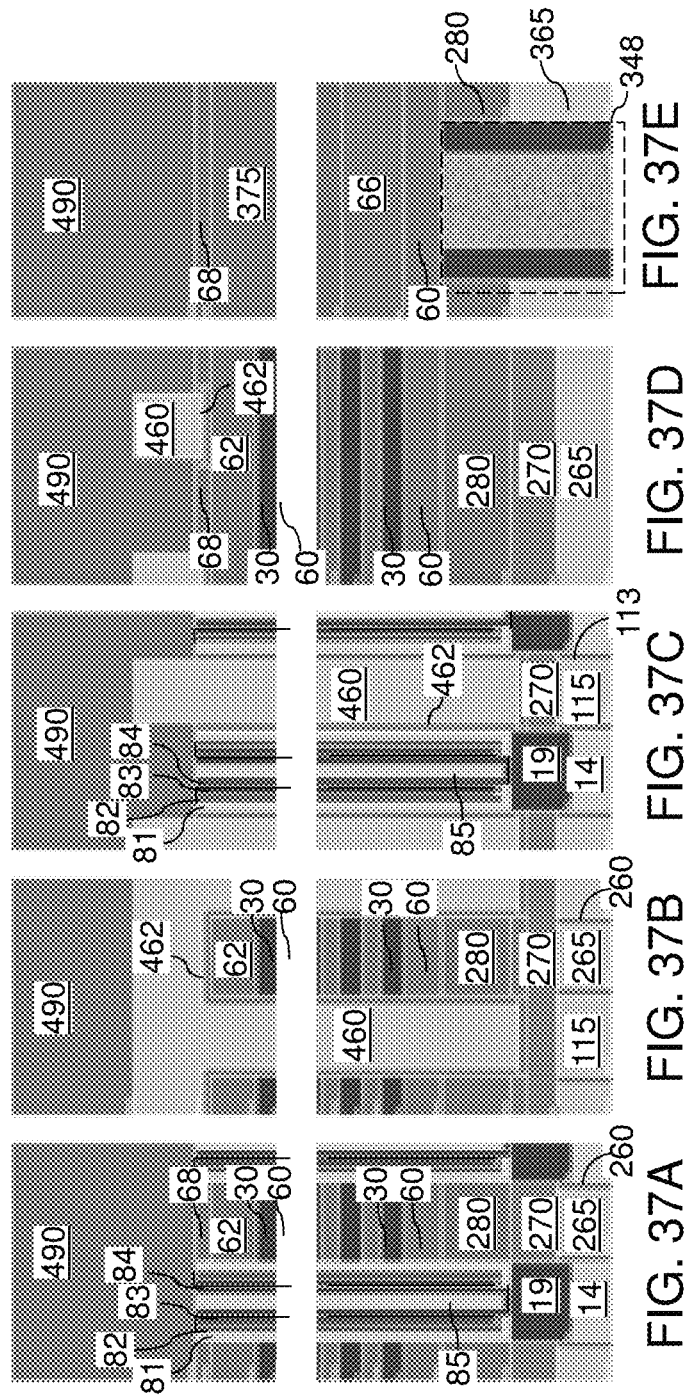

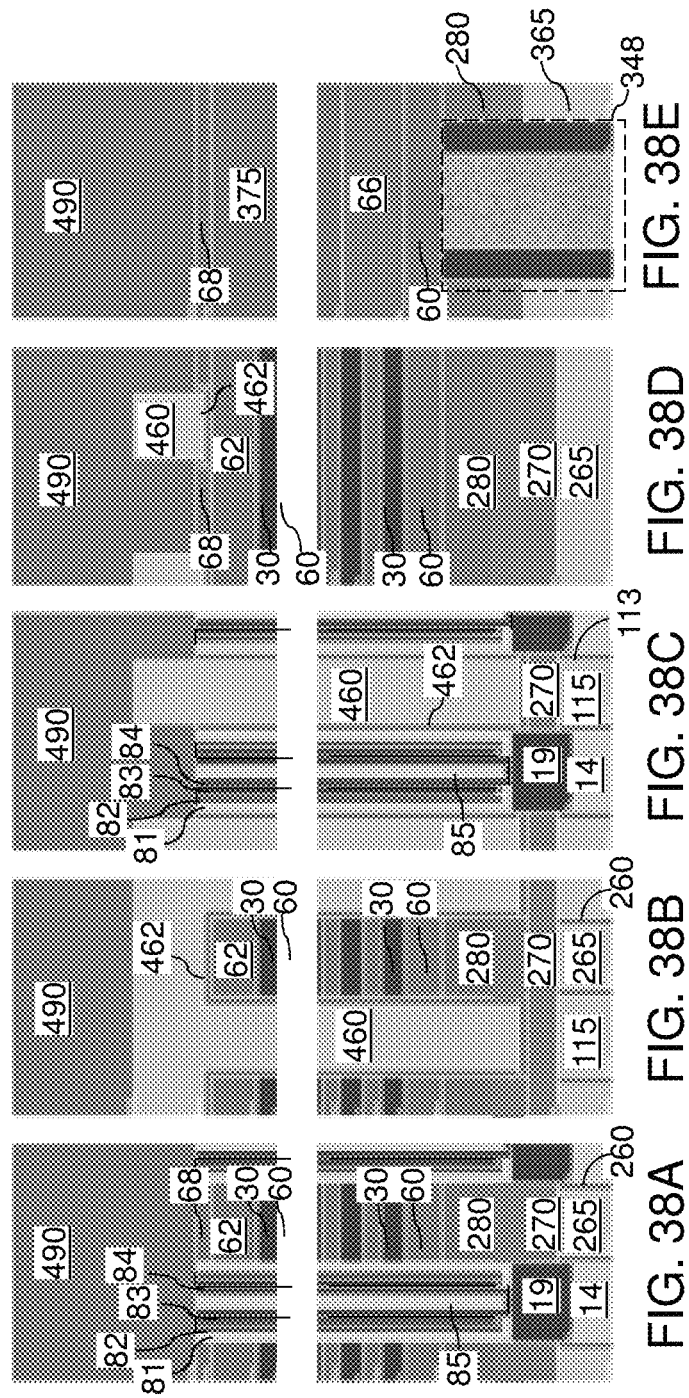

RESISTIVE MEMORY DEVICE CONTAINING ETCH STOP STRUCTURES FOR VERTICAL BIT LINE FORMATION AND METHOD OF MAKING THEREOF

FIELD

The present disclosure relates generally to the field of semiconductor devices and specifically to three-dimensional resistive memory (ReRAM) devices employing etch stop structures overlying vertical field effect transistors and methods of making the same.

BACKGROUND

Resistive Random Access Memory, or "ReRAM," is a non-volatile memory device employing reversible change in resistance in a thin film with application of electrical voltage bias across the film. Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman A resistive memory cell can be programmed into a set state having a low electrical resistance, or a reset state having a high resistance. A write operation stores data in a set of resistive memory cells by programming each resistive memory cell into a set state or a reset state depending on the contents of the data. For example, "1" can correspond to a set state and "0" can correspond to a reset state, or vice versa.

SUMMARY

According to an aspect of the present disclosure, a resistive memory device includes a two-dimensional array of vertical field effect transistors located over a substrate and including a two-dimensional array of semiconductor pillars laterally spaced among one another by dielectric rail structures that extend along in a first horizontal direction, and laterally spaced among one another in the second horizontal direction by dielectric pillar structures, an etch stop dielectric material layer overlying top surfaces of the dielectric rail structures and the dielectric pillar structures and including openings in areas that overlie the two-dimensional array of semiconductor pillars, an array of metal nitride portions located within the openings in the etch stop dielectric material layer and electrically connected to top surfaces of each semiconductor pillar within the two-dimensional array of semiconductor pillars, a two-dimensional array of vertical bit lines electrically connected to the metallic nitride portions, alternating layer stacks located between neighboring rows of the vertical bit lines and overlying the etch stop dielectric material layer, wherein each of the alternating layer stacks comprises a vertically alternating sequence of insulating strips and electrically conductive word line strips, and a vertical stack of resistive memory elements located between each of the vertical bit lines and alternating layer stacks to provide a three-dimensional resistive memory element array.

According to another aspect of the present disclosure, a method of forming a resistive memory device is provided, which comprises the steps of: forming vertical field effect transistors including a two-dimensional array of semiconductor pillars, wherein the semiconductor pillars are laterally spaced among one another in a first horizontal direction by dielectric rail structures that extend along a second horizontal direction, and are laterally spaced among one another in the second horizontal direction by dielectric pillar structures, and each of the semiconductor pillars comprises a bottom active region, a channel region, and a top active region; forming metal nitride portions over on top surfaces of each semiconductor pillar within the two-dimensional array of semiconductor pillars; forming a dielectric material layer over top surfaces of the dielectric rail structures and the dielectric pillar structures around the metal nitride portions over the two-dimensional array of semiconductor pillars; forming a layer stack including an alternating sequence of insulating layers and electrically conductive layers over top surfaces of the metal nitride portions and over a top surface of the dielectric material layer; patterning the layer stack to form alternating layer stacks that are laterally spaced among one another over the dielectric material layer, wherein each of the alternating layer stacks comprises a vertically alternating sequence of insulating strips and electrically conductive word line strips; forming a two-dimensional array of vertical stacks of resistive memory elements between neighboring pairs of alternating layer stacks; and forming vertical bit lines within each of the vertical stacks of resistive memory elements and over a respective one of the metal nitride portions.

BRIEF DESCRIPTION OF THE DRAWINGS

In the various drawings of the instant disclosure, a set of drawings having a same numeric figure index (such as 1, 2, 3, etc.) and different alphabetical suffixes (such as A, B, C, D, E, and F) correspond to a same processing step. Alphabetical suffixes of A, B, C, D, and E correspond to vertical cross-sectional views along vertical cross-sectional planes A-A', B-B', C-C', D-D', and E-E', respectively, which may be shown in a top-down view having the same numeric figure index and having the alphabetical suffix F, or may correspond to a respective vertical cross-sectional plane shown in other top-down views having the alphabetical index F.

FIGS. 1A-1F are various views of an exemplary structure after formation of global bit lines embedded within an dielectric material layer according to an embodiment of the present disclosure.

FIGS. 2A-2E are various views of the exemplary structure after formation of a planar layer stack including a bottom semiconductor layer, a channel semiconductor layer, a top semiconductor layer, a metal nitride layer, and a lower hard mask layer according to an embodiment of the present disclosure.

FIGS. 3A-3F are various views of the exemplary structure after patterning the planar layer stack into semiconductor rail structures and metal nitride strips that are laterally spaced apart along a first horizontal direction through formation of first line trenches that laterally extend along a second horizontal direction according to an embodiment of the present disclosure.

FIGS. 4A-4E are various views of the exemplary structure after formation of dielectric trench fill portions in the first line trenches according to an embodiment of the present disclosure.

FIGS. 5A-5E are various views of the exemplary structure after formation of an upper hard mask layer according to an embodiment of the present disclosure.

FIGS. 6A-6F are various views of the exemplary structure after patterning the semiconductor rail structures and metal nitride strips into semiconductor pillars and metal nitride portions through formation of second line trenches according to an embodiment of the present disclosure.

FIGS. 7A-7E are various views of the exemplary structure after formation of a gate dielectric layer, a spacer dielectric liner layer, and spacer dielectric portions according to an embodiment of the present disclosure.

FIGS. 8A-8E are various views of the exemplary structure after removal of vertical portions of the spacer dielectric liner layer and formation of spacer dielectric liners and disposable dielectric liner strips according to an embodiment of the present disclosure.

FIGS. 9A-9E are various views of the exemplary structure after formation of a gate electrode layer according to an embodiment of the present disclosure.

FIGS. 10A-10E are various views of the exemplary structure after formation of gate electrode lines according to an embodiment of the present disclosure.

FIGS. 11A-11E are various views of the exemplary structure after formation of a sacrificial liner according to an embodiment of the present disclosure.

FIGS. 12A-12E are various views of the exemplary structure after formation of an etch mask layer according to an embodiment of the present disclosure.

FIGS. 13A-13F are various view of the exemplary structure after trimming the gate electrode lines and removing the etch mask layer according to an embodiment of the present disclosure.

FIGS. 14A-14E are various views of the exemplary structure after formation of a dielectric rail liner and dielectric rail structures according to an embodiment of the present disclosure.

FIGS. 15A-15F are various views of the exemplary structure after removing remaining portions of the hard mask layers by a planarization process according to an embodiment of the present disclosure.

FIGS. 16A-16E are various views of the exemplary structure after selective recessing of dielectric material portions with respect to metal nitride portions according to an embodiment of the present disclosure.

FIGS. 17A-17E are various views of the exemplary structure after deposition of a dielectric material over, and among, the metal nitride portions to form a blanket dielectric material layer according to an embodiment of the present disclosure.

FIGS. 18A-18E are various views of the exemplary structure after recessing the blanket dielectric material layer to form a patterned dielectric material layer according to an embodiment of the present disclosure.

FIGS. 19A-19E are various views of the exemplary structure after formation of an insulating material layer and a contact via cavity according to an embodiment of the present disclosure.

FIGS. 20A-20E are various views of the exemplary structure after formation of an insulated contact via structure according to an embodiment of the present disclosure.

FIGS. 21A-21E are various views of the exemplary structure after formation of a layer stack including an alternating sequence of insulating layers and electrically conductive layers over the metal nitride portions and over the dielectric material layer, and formation of an insulating cap layer and a sacrificial cap layer according to an embodiment of the present disclosure.

FIGS. 22A-22E are various views of the exemplary structure after removing the sacrificial cap layer, the insulating cap layer, and the layer stack from a contact region according to an embodiment of the present disclosure.

FIGS. 23A-23E are various views of the exemplary structure after formation of a dielectric liner and a dielectric fill material portion according to an embodiment of the present disclosure.

FIGS. 24A-24E are various views of the exemplary structure after removal of dielectric liner and the sacrificial cap layer, recessing of the dielectric fill material portion, and deposition of an insulating material layer to an embodiment of the present disclosure.

FIGS. 25A-25F are various views of the exemplary structure after patterning the layer stack of the alternating sequence of insulating layers and electrically conductive layers into alternating layer stacks by forming memory level trenches according to embodiment of the present disclosure.

FIGS. 26A-26F are various views of the exemplary structure after formation of sacrificial rails according to an embodiment of the present disclosure.

FIGS. 27A-27E are various views of the exemplary structure after formation of a first hard mask layer and a second hard mask layer according to an embodiment of the present disclosure.

FIGS. 28A-28F are various views of the exemplary structure after forming line trenches through the second hard mask layer and an upper portion of the first hard mask layer according to an embodiment of the present disclosure.

FIGS. 29A-29E are various views of the exemplary structure after formation of memory level cavities through the alternating layer stacks and the sacrificial rails according to an embodiment of the present disclosure.

FIGS. 30A-30E are various views of the exemplary structure after formation of memory level insulating rails and removal of the second hard mask layer according to an embodiment of the present disclosure.

FIGS. 31A-31E are various views of the exemplary structure after removal of the first hard mask layer according to an embodiment of the present disclosure.

FIGS. 32A-32F are various views of the exemplary structure after removal of remaining portions of the sacrificial rails and formation of a two-dimensional array of cavities among the alternating layer stacks according to an embodiment of the present disclosure.

FIGS. 33A-33E are various views of the exemplary structure after formation of material layers that include a resistive memory material layer within each of the cavities within the two-dimensional array of cavities according to an embodiment of the present disclosure.

FIGS. 34A-34E are various views of the exemplary structure after anisotropically etching the material layers within the two-dimensional array of cavities according to an embodiment of the present disclosure.

FIGS. 35A-35E are various views of the exemplary structure after formation of a conductive metallic liner and a conductive fill material in remaining volumes of the cavities according to an embodiment of the present disclosure.

FIGS. 36A-36G are various views of the exemplary structure after formation of vertical bit lines by vertically recessing the conductive fill material according to an embodiment of the present disclosure. FIG. 36G is a horizontal cross-sectional view of the exemplary structure of FIGS. 36A-36F along the horizontal plane G-G'.

FIGS. 37A-37E are various views of the exemplary structure after formation of a planarization dielectric layer according to an embodiment of the present disclosure.

FIGS. 38A-38E are various views of an alternative embodiment of the exemplary structure according to an embodiment of the present disclosure.

DETAILED DESCRIPTION

Figure 3F:
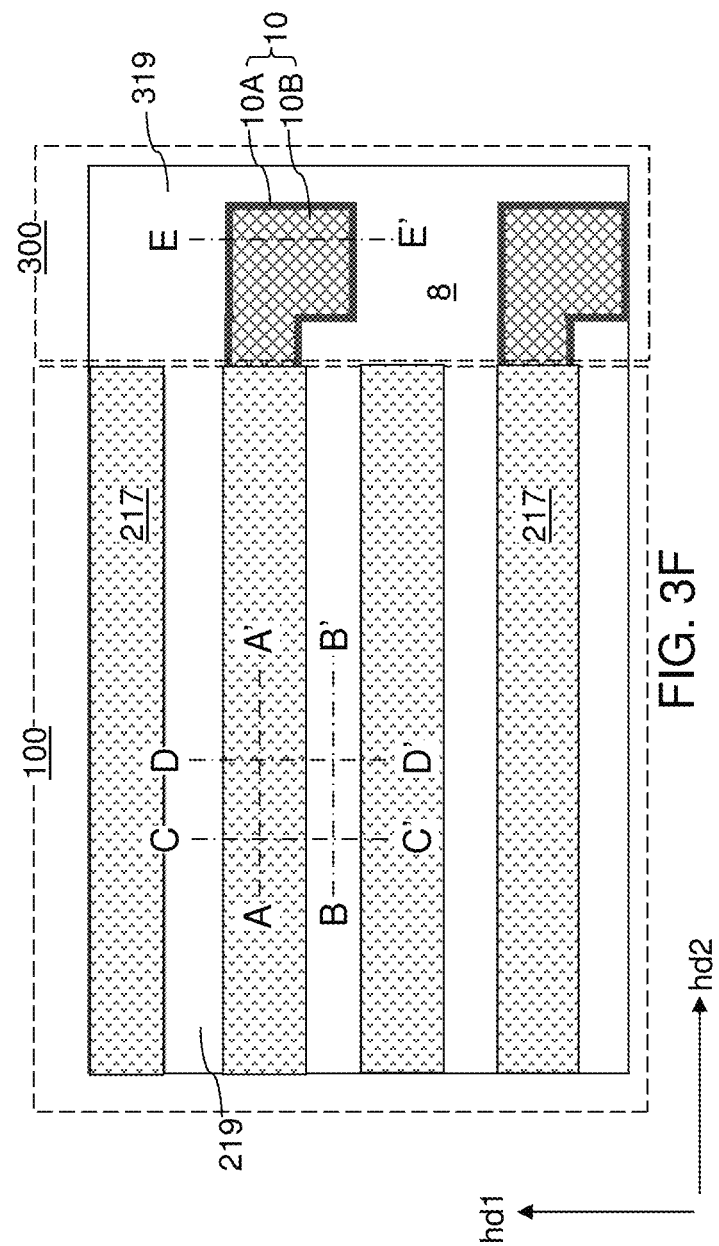

Manufacturing of three-dimensional resistive random access memory (ReRAM) devices employs several anisotropic etch processes, and etch stop structures are used to prevent over etching of underlying materials. The present inventors realized that an insulating etch stop layer, such as a silicon nitride layer, located over the underlying vertical select transistor is difficult to etch during the etching of the resistive memory material layer. Therefore, this etch stop layer may not be fully removed such that the vertical bit line of the ReRAM device does not electrically contact the underlying drain region of the vertical select transistor.

Thus, in one embodiment of the present disclosure, the insulating etch stop layer is not located over the drain region of the vertical select transistor during the etching of the resistive memory material layer to ensure that the vertical bit line makes electrical contact with the underlying vertical select transistor drain region. In another embodiment, the insulating etch stop layer, such as a silicon nitride layer, is retained over dielectric pillar structures which are located between the vertical select transistors to protect the dielectric pillar structures during various anisotropic etching steps.

As discussed above, the present disclosure is directed to a three-dimensional resistive random access memory (ReRAM) devices and other three-dimensional devices, and methods of making the same, the various aspects of which are described below. The embodiments of the disclosure can be employed to form various semiconductor devices such as three-dimensional monolithic memory array devices comprising ReRAM devices. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material", "insulating material" or a "dielectric material" refers to a material having electrical conductivity less than $1.0 \times 10^{-6}$ S/cm.

As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

The various three dimensional memory devices of the present disclosure can include a ReRAM device, and can be fabricated employing the various embodiments described herein. It is understood that a criss-cross array of memory elements that can be accessed by any access scheme can be employed for the resistive memory devices of the present disclosure, and the exemplary structures of the present disclosure are described herein merely provide non-limiting examples of implementation of the memory devices of the present disclosure.

Referring to FIGS. 1A-1F, an exemplary structure is illustrated, which can be an in-process ReRAM device. As used herein, a "prototype" structure or an "in-process" structure refers to a transient structure that is subsequently modified in the shape or composition of at least one component therein.

The exemplary structure includes a substrate 6, which includes an insulating layer at an upper portion thereof. In one embodiment, the substrate 6 can be a stack of at least two material layers such as a stack of an underlying substrate material layer and an overlying substrate insulating layer. The substrate material layer can be a semiconductor material layer, a conductive material layer, or an insulating material layer that can provide structural support to the overlying structures, and may have a thickness greater than 50 microns, and typically in a range between 300 microns and 3 mm In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense amplifiers, input-output (I/O) circuitry, control circuitry, and any other necessary peripheral circuitry can be formed on, or in, the substrate material layer. Additional devices that can be formed in, or on, the substrate material layer include, but are not limited to, global bit line select transistors for selecting global bit lines to be activated, local bit line select transistors for selecting local bit lines to be activated, and word line select transistor for selecting word lines to be activated.

Global bit lines 10 are formed over the substrate 6. The global bit lines 10 laterally spaced from one another by a dielectric material layer 8, which may be formed before, or after, formation of the global bit lines 10. The global bit lines 10 are parallel electrically conductive lines that are laterally spaced apart in a first horizontal direction hd1, and extending in a second horizontal direction hd2. A one-dimensional array of the global bit lines 10 can extend along the second horizontal direction hd2. The global bit lines 10 can include, for example, at least one elemental metal (such as W, Co, Cu, and Al), a conductive doped semiconductor material, an intermetallic alloy including at least two elemental metals, a conductive metallic nitride, or a conductive metallic carbide. For example, the global bit lines 10 can include a metallic barrier layer 10A including a metallic nitride material such as TiN, TaN, or WN, and a metal layer 10B including an elemental metal or an intermetallic alloy, such as W, Ti, Ta, Cu, Al, or an alloy thereof.

The global bit lines 10 extend along the second horizontal direction hd2 in a memory array region 100 (in which a memory array is subsequently formed) and extends into at least one contact region 300 (in which contact via structures, such as zias, are subsequently formed) that is adjacent to the memory array region 100. Contact tabs having a greater width than an adjoining global bit line 10 can be provided at an end portion of each global bit line 10 in the at least one contact region 300.

The global bit lines 10 can be formed, for example, by depositing at least one conductive material layer, and patterning the at least one conductive material layer employing a combination of lithographic methods and an anisotropic etch. In this case, the dielectric material layer 8 can be formed by deposition of an insulating material between the global bit lines 10 and subsequent planarization. Alternatively, the one-dimensional array of the global bit lines 10 may be formed by depositing the dielectric material layer 8, forming line trenches extending along the second horizontal direction hd2 and laterally spaced from one another along the first horizontal direction hd1, and filling the line trenches with at least one conductive material and subsequent planarization to form the global bit lines 10 therein by a damascene process.

Referring to FIGS. 2A-2E, a planar layer stack (11L, 114L, 19L, 121L) is formed over the global bit lines 10. The planar layer stack (11L, 114L, 19L, 121L) can include, from bottom to top, a lower metal nitride layer 11L, a bottom semiconductor layer 114B, a channel semiconductor layer 114C, a top semiconductor layer 114T, a upper metal nitride layer 19L, and a lower hard mask layer 121L.

The lower metal nitride layer 11L includes a conductive metal nitride material such as TiN, TaN, WN, or a stack thereof. In one embodiment, the lower metal nitride layer 11L can function as a diffusion barrier between the metallic materials of the global bit lines 10 and the bottom semiconductor layer 114B. In one embodiment, the lower metal nitride layer 11L can have a thickness in a range from 3 nm to 60 nm, such as from 5 nm to 20 nm. The lower metal nitride layer 11L can be deposited by chemical vapor deposition or atomic layer deposition.

The bottom semiconductor layer 114B and the top semiconductor layer 114T can include a respective semiconductor material having a doping of a first conductivity type. The first conductivity type can be p-type or n-type. The dopant concentration in the bottom semiconductor layer 114B and the top semiconductor layer 114T can be in a range from $1.0 \times 10^{19}/cm^3$ to $2.0 \times 10^{21}/cm^3$, although lesser and greater dopant concentrations can also be employed. The thickness of the bottom semiconductor layer 114B can be the thickness of the bottom active regions of the access vertical field effect transistors to be formed, and the thickness of the top semiconductor layer 114T can be the thickness of the top active regions of the access vertical field effect transistors to be formed. For example, the thickness of the bottom semiconductor layer 114B can be in a range from 30 nm to 300 nm, and the thickness of the top semiconductor layer 114T can be in a range from 30 nm to 300 nm.

The channel semiconductor layer 114C can include a semiconductor material having a second conductivity type that is the opposite type of the first conductivity type. The dopant concentration in the channel semiconductor layer 114C can be in a range from $1.0 \times 10^{14}/cm^3$ to $2.0 \times 10^{18}/cm^3$, although lesser and greater dopant concentrations can also be employed. The thickness of the channel semiconductor layer 114C can be the channel length of the access vertical field effect transistors to be formed. For example, the thickness of the channel semiconductor layer 114C can be in a range from 100 nm to 3,000 nm, although lesser and greater thicknesses can also be employed. The bottom semiconductor layer 114B, the channel semiconductor layer 114C, and the top semiconductor layer 114T are collectively referred to as a semiconductor layer stack 114L.

The upper metal nitride layer 19L includes a conductive metal nitride material such as TiN, TaN, WN, or a stack thereof. In one embodiment, the upper metal nitride layer 19L has thick enough to function as an etch stop layer in a subsequent etch process that forms alternating stacks that include word lines for memory cells. In one embodiment, the upper metal nitride layer 19L can have a thickness in a range from 25 nm to 100 nm, such as from 35 nm to 70 nm. The upper metal nitride layer 19L can be deposited by chemical vapor deposition or atomic layer deposition. Alternatively, an optional titanium layer may be formed under the upper metal nitride layer 19L and then thermally reacted with the underlying top semiconductor layer 114T to form an optional titanium silicide layer between the top semiconductor layer 114T and the upper metal nitride layer 19L.

The lower hard mask layer 121L includes a material that can be function as a hard mask during a subsequent etch process that patterns the metallic nitride layer 19L and the semiconductor layer stack 114L. In one embodiment, the lower hard mask layer 121L includes silicon nitride. The thickness of the lower hard mask layer 121L can be in a range from 30 nm to 300 nm, although lesser and greater thicknesses can also be employed. The lower hard mask layer 121L can be deposited, for example, by chemical vapor deposition (CVD).

Referring to FIGS. 3A-3F, a photoresist layer 217 is applied over the lower hard mask layer 121L, and is lithographically patterned to form a pattern of line trenches therein. The photoresist layer 217 can be formed such that the remaining areas of the photoresist layer 217 overlap with the areas of the global bit lines 10 in the memory array region 100. Further, the photoresist layer 217 can be patterned such that the at least one contact region 300 is not covered by the patterned photoresist layer 217.

The pattern in the photoresist layer 217 can be transferred through the lower hard mask layer 121L, the upper metal nitride layer 19L, the semiconductor layer stack 114L, and the lower metal nitride layer 11L by at least one anisotropic etch process. First line trenches 219 are formed between remaining portions of the lower hard mask layer 121L, the upper metal nitride layer 19L, and the semiconductor layer stack 114L in the memory array region. A cavity region 319 is formed in the contact region 300. Each first line trench 219 can laterally extend along the second horizontal direction hd2. A top surface of the dielectric material layer 8 can be physically exposed at the bottom of each line trench 219. A top surface a tab portion of each global bit line 10 can be physically exposed in the at least one contact region 300.

Each remaining portion of the lower hard mask layer 121L constitutes a lower hard mask portion 121, which is a hard mask strip that laterally extends along the second horizontal direction hd2. Each remaining portion of the upper metal nitride layer 19L constitutes a metal nitride portion 19, which is a metal nitride strip that laterally extends along the second horizontal direction hd2. Each remaining portion of the semiconductor layer stack 114L constitutes a semiconductor rail 114R that laterally extends along the second horizontal direction hd2. Each semiconductor rail 114R includes, from bottom to top, a bottom semiconductor strip 114B, a channel semiconductor strip 114C, and a top semiconductor strip 114T. The lower metal nitride layer 11L is divided into multiple strips. The photoresist layer 217 can be subsequently removed, for example, by ashing.

Referring to FIGS. 4A-4E, a dielectric trench liner 113 can be deposited on the sidewalls of the semiconductor rails 114R, the metal nitride portions 19, and the lower hard mask portions 121. The dielectric trench liner 113 includes a dielectric material such as silicon nitride or a dielectric metal oxide (such as aluminum oxide). The thickness of the dielectric trench liner 113 can be in a range from 1 nm to 10 nm, although lesser and greater thicknesses can also be employed.

A dielectric fill material is deposited in the first line trenches 219 and in the cavity region 319. The dielectric fill material can include undoped silicate glass or doped silicate glass, such as a flowable silicon oxide deposited by CVD. Excess portions of the dielectric fill material can be removed from above the top surfaces of the lower hard mask portions 121 by a planarization process, which can employ chemical mechanical planarization (CMP), a recess etch, or a combination thereof. Horizontal portions of the dielectric trench liner 113 overlying the lower hard mask portions 121 can be removed during the planarization process. Each first line trench 219 can be filled with a respective portion of the dielectric trench liner 113 and a dielectric trench fill portion 215. Each cavity region 319 can be filled with a horizontal portion of the dielectric trench liner 113 and a temporary dielectric fill material portion 315. The top surfaces of the dielectric trench fill portions 215 and the temporary dielectric fill material portions 315 can be coplanar with the top surfaces of the lower hard mask portions 121.

Referring to FIGS. 5A-5E, an upper hard mask layer 131L can be deposited on the planar top surfaces of the dielectric trench fill portions 215, the temporary dielectric fill material portions 315, and the lower hard mask portions 121. The upper hard mask layer 131L can include a dielectric material such as silicon nitride. The thickness of the upper hard mask layer 131L can be a range from 30 nm to 300 nm, although lesser and greater thicknesses can also be employed.

Figure 6F:
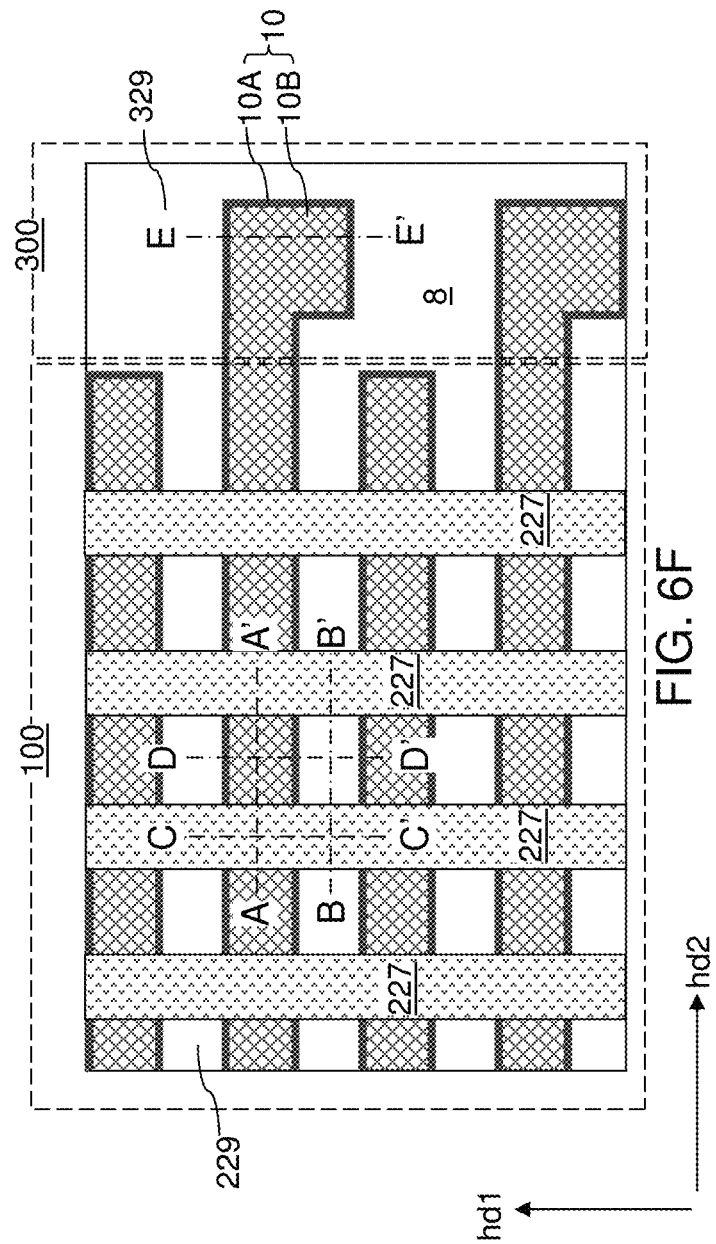

Referring to FIGS. 6A-6F, a photoresist layer 227 can be applied over the upper hard mask layer 131L, and can be lithographically patterned to form a pattern of line trenches that laterally extend along the first horizontal direction hd1. The pattern of line trenches in the photoresist layer 227 can be transferred through the underlying material portions above the horizontal plane including the top surface of the global bit lines 10 by at least one anisotropic etch process. Second line trenches 229 laterally extending along the first horizontal direction hd1 are formed.

The upper hard mask layer 131L is patterned into upper hard mask strips 131 that laterally extend along the first horizontal direction hd1. Each strip of a lower hard mask portion 121 is divided by the second line trenches 229 into multiple discrete lower hard mask portions 121, each of which can have a respective rectangular horizontal cross-sectional shape. Each strip of a metal nitride portion 19 (i.e., each upper metal nitride strip) is divided by the second line trenches 229 into multiple discrete metal nitride portions 19, each of which can have a respective rectangular cross-sectional shape that the same as the horizontal cross-sectional shape of an overlying lower hard mask portion 121.

Each semiconductor rail 114R is divided by the second line trenches 229 into semiconductor pillars 14, each of which can have a horizontal cross-sectional shape that is the same as the horizontal cross-sectional shape of an overlying metal nitride portion 19. Each semiconductor pillar 14 can include a bottom active region (e.g., source region of the vertical select transistor) 14B, a channel region 14C, and a top active region (e.g., drain region of the vertical select transistor) 14T. Each bottom active region 14B is a patterned portion of the bottom semiconductor layer 114B, each channel portion 14C is a patterned portion of the channel semiconductor layer 114C, and each top active region 14T is a patterned portion of the top semiconductor layer 114T. Each strip of the lower metal nitride layer 11L, i.e., each lower metal nitride strip, is divided by the second line trenches 229 into multiple lower metal nitride portions 11.

Each dielectric trench fill portion 215 is divided by the second line trenches 229 into dielectric pillar structures 115. Each portion of the dielectric trench liner 113 that is not covered by the patterned photoresist layer 227 can be removed after, or during, removal of the portions of the dielectric trench fill portions 215 that are not covered by the patterned photoresist layer 227. An isotropic etch or an isotropic etch may be employed to remove the portions of the dielectric trench liner 113 within areas that are not covered by the patterned photoresist layer 227.

The temporary dielectric fill material portion 315 can be removed during removal of the unmasked portions of the dielectric trench fill portion 215. The portion of the dielectric trench liner 113 located in the contact region 300 can be removed during removal of unmasked portions of the dielectric trench liner 113 from underneath the second line trenches 229. A cavity region 329 is formed in each contact region 300. The patterned photoresist layer 227 can be subsequently removed, for example, by ashing.

The lower metal nitride portions 11, the semiconductor pillars 14, the upper metal nitride pillars 19, and the lower hard mask portions 121 can be arranged as a two-dimensional array of pillar structures (11, 14, 19, 121). Each pillar structure (11, 14, 19, 121) can have a top surface that is a top surface of the lower hard mask portion 121 therein, a bottom surface that is a bottom surface of the lower metal nitride portion 11 therein, and four sidewalls that are adjoined to the top surface and the bottom surface of the pillar structure (11, 14, 19, 121). Each sidewall of the pillar structure (11, 14, 19, 121) can have a rectangular shape, and can be vertical. Each sidewall of the pillar structure (11, 14, 19, 121) can include a rectangular sidewall of a lower hard mask portion 121, a rectangular sidewall of an metal nitride portion 19, a rectangular sidewall of a semiconductor pillar 14, and a rectangular sidewall of a lower metal nitride portion 11.

Each metal nitride portion 19 can be located over top surfaces of an underlying semiconductor pillar 14 within the two-dimensional array of semiconductor pillars 14. Each metal nitride portion 19 can directly contact the top surfaces of the underlying semiconductor pillar 14 or another electrically conductive layer, such as a titanium silicide layer, can be located between each metal nitride portion 19 and the underlying semiconductor pillar 14. In one embodiment, sidewalls of the metal nitride portions 19 can be vertically coincident with sidewalls of semiconductor pillars 14. As used herein, a first sidewall is "vertically coincident" with a second sidewall if the second sidewall overlies or underlies the first sidewall and if there exists a vertical plane that includes the first sidewall and the second sidewall. Each of the dielectric trench liners 113 includes two vertical portions and a horizontal portion adjoined to bottom ends of the two vertical portions, and vertically extends from a bottom edge of a sidewall of one of the semiconductor pillars 14 to a top edge of the sidewall of the one of the semiconductor pillars 14.

Referring to FIGS. 7A-7E, a gate dielectric layer 15 can be formed on the physically expose sidewalls of the semiconductor pillars 14. The gate dielectric layer 15 can be formed as a continuous material layer by conformal deposition of at least one gate dielectric material (such as silicon oxide and/or a dielectric metal oxide), or can be formed by thermal oxidation and/or plasma oxidation of physically exposed sidewalls of the semiconductor pillars 14. In one embodiment, the gate dielectric layer 15 can be formed as a continuous material layer on sidewalls of the dielectric pillar structures 115. While the present disclosure is described employing an embodiment in which the gate dielectric layer 15 is formed by deposition of a dielectric material to form a continuous conformal material layer, embodiments are expressly contemplated herein in which the gate dielectric layer 15 is formed by thermal and/or plasma oxidation of only the surface portions of the semiconductor pillars 14. The thickness of the gate dielectric layer 15 can be in a range from 1 nm to 10 nm, although lesser and greater thicknesses can also be employed.

A spacer dielectric liner layer 240L can be formed as a conformal dielectric material layer on the gate dielectric layer 15. The spacer dielectric liner layer 240L includes a dielectric material that is different from the outermost dielectric material of the gate dielectric layer 15. For example, if the gate dielectric layer 15 includes silicon oxide and/or a dielectric metal oxide, the spacer dielectric liner layer 240L can include a conformal silicon nitride layer. The thickness of the spacer dielectric liner layer 240L can be in a range from 3 nm to 30 nm, although lesser and greater thicknesses can also be employed.

A dielectric material is anisotropically deposited on horizontal surfaces of the exemplary structure, while minimizing deposition on vertical surfaces of the exemplary structure. The dielectric material can include doped silicate glass or undoped silicate glass (e.g., silicon oxide). The dielectric material can be deposited by depletive chemical vapor deposition (e.g., high density plasma CVD) or by physical vapor deposition. Optionally, portions of the deposited dielectric material on vertical surfaces can be removed by an etch back process, which can be an isotropic etch process such as a wet etch process. The thickness of the spacer dielectric material can be in a range from 10 nm to 60 nm, although lesser and greater thicknesses can also be employed.

After an anisotropic deposition process and an optional isotropic etch back process, the deposited dielectric materials remain at the bottom of the second line trenches 229, over the top surfaces of the upper hard mask strips 131, and in the contact regions 300. Each portion of the deposited dielectric material that remains at the bottom of the second line trenches 229 constitutes a spacer dielectric portion 40B, each portion of the deposited dielectric material that remains on the upper hard mask strips 131 constitutes a disposable dielectric material strip 40T, and each portion of the deposited dielectric material that remains in the contact regions 300 constitutes a planar dielectric material portion 40P. The top surfaces of the spacer dielectric portions 40B can be located within a horizontal plane in which bottom edges of the gate electrode lines are to be subsequently formed. Thus, the height of the spacer dielectric portions 40B determines the overlap of the gate electrode lines to be formed with the bottom active regions 14B. Preferably, the spacer dielectric portions 40B are thinner than the bottom active regions 14B, such that the top of the spacer dielectric portions 40B is located below the channel regions 14C.

Referring to FIGS. 8A-8E, an isotropic etch process can be performed to etch physically exposed portions of the spacer dielectric liner layer 240L, which are vertical portions of the spacer dielectric liner layer 240L that are located around the second line trenches 229. For example, if the spacer dielectric liner layer 240L includes silicon nitride, a wet etch employing hot phosphoric acid can be employed. Each remaining portion of the spacer dielectric liner layer 240L underlying and masked by the spacer dielectric portions 40B is herein referred to as spacer dielectric liner 40A. Each remaining portion of the spacer dielectric liner layer 240L overlying the upper hard mask strips 131 and underlying and masked by the disposable dielectric material strip 40T is herein referred to as a disposable dielectric liner strip 240. Each remaining portion of the spacer dielectric liner layer 240L underlying the planar dielectric material portion 40P is herein referred to as a planar dielectric liner 340.

Referring to FIGS. 9A-9E, a gate electrode layer 16L can be deposited as a conformal conductive material layer. The gate electrode layer 16L includes a conductive material such as an elemental metal, an intermetallic alloy, a heavily doped semiconductor material, a metal-semiconductor alloy such as a metal silicide material, a conductive metallic nitride such as TiN, TaN, or WN, or a combination thereof. The gate electrode layer 16L can be deposited by a conformal deposition process such as chemical vapor deposition or atomic layer deposition. The thickness of the gate electrode layer 16L is selected such that the second line trenches 229 are not completely filled by the gate electrode layer 16L, but a line cavity 229C is present within each second line trench 229. The thickness of the gate electrode layer 16L can be in a range from 5 nm to 100 nm, such as from 10 nm to 50 nm, although lesser and greater thicknesses can also be employed.

Referring to FIGS. 10A-10E, and anisotropic etch process is performed to remove horizontal portions of the gate electrode layer 16L. Remaining vertical portions of the gate electrode layer 16L located on the gate dielectric layer 15 and laterally extending along the first horizontal direction hd1 constitute gate electrode lines 16. Each gate electrode line 16 can be formed directly on a sidewall of the gate dielectric layer 15. The gate electrode layer 16L is removed from the top and sides of the disposable dielectric material strip 40T. However, the overhang portion of the disposable dielectric material strip 40T protects the underlying portion of the gate electrode layer 16L on the gate dielectric layer 15 adjacent to the channel region 14C from being completely removed.

Referring to FIGS. 11A-11E, a sacrificial liner 250 can be formed as a conformal material layer on the gate electrode lines 16. The sacrificial liner 250 includes a material that protects the gate electrode lines 16 during a subsequent etch process. For example, the sacrificial liner 250 can include silicon nitride. The thickness of the sacrificial liner 250 can be in a range from 2 nm to 20 nm, although lesser and greater thicknesses can also be employed.

Referring to FIGS. 12A-12E, an etch mask material is applied to the exemplary structure, and can be planarized to provide a horizontal top surface. The etch mask material can include, for example, a photoresist material, an organic polymer material, an inorganic polymer material, a carbon-based material such as amorphous carbon, or any other suitable material that is self-planarizing or can be planarized. The etch mask material is vertically recessed such that the recessed top surface of the etch mask material is located at the height at which the top edges of the gate electrode lines 16 are to be subsequently formed by trimming the gate electrode lines. Thus, the height of the etch mask material after the recess process determines the overlap of the top active regions 14T with the gate electrode lines 16 to be formed through a subsequent trimming process. The etch mask material as recessed is herein referred to as an etch mask layer 251. The top of the etch mask layer 251 is preferably positioned above the bottom of the top active regions 14T but below the top of the top active regions 14T.

Referring to FIGS. 13A-13F, the portions of the sacrificial liner 250 that are not covered by the etch mask layer 251 can be removed by an isotropic etch process such as a wet etch process. The portions of the gate electrode lines 16 that are not covered by the etch mask layer 251 can be isotropically etched to trim the gate electrode lines 16. The isotropic etch process that etches the physically exposed portions of the gate electrode lines 16 can be a wet etch process.

The disposable dielectric material strips 40T can be subsequently removed by an etch process, which can be an isotropic etch process. The disposable dielectric liner strips 240 can be removed by another etch process, which can be an isotropic etch process. During the series of etch processes that removes the physically exposed portions of the sacrificial liner 250, upper portions of the gate electrode lines 16, the disposable dielectric material strips 40T, and the disposable dielectric liner strips 240, the etch mask layer 251 can prevent etching of covered material portions underneath. Subsequently, the etch mask layer 251 can be removed selective to the semiconductor pillars 14, the metal nitride portions 19, the lower hard mask portions 121, the upper hard mask strips 131, and the dielectric pillar structures 115. For example, the etch mask layer 251 can be removed by ashing at an elevated temperature.

Referring to FIGS. 14A-14E, a dielectric rail liner 260 can be formed by conformal deposition of a dielectric material such as silicon nitride. The thickness of the dielectric rail liner 260 can be in a range from 2 nm to 10 nm, although lesser and greater thicknesses can also be employed. The dielectric rail liner 260 can be formed directly on sidewalls of upper portions 14T of the semiconductor pillars 14, upper portions of the dielectric pillar structures 115, and sidewalls of the gate electrode lines 16.

A dielectric material is deposited in remaining unfilled volumes of the second line trenches and in the contact region 300. The dielectric material can be a planarizable dielectric material such as doped silicate glass or undoped silicate glass (e.g., silicon oxide formed by flowable CVD and/or by a densified TEOS CVD process). Excess portions of the dielectric material can be removed from above a horizontal plane including the top surfaces of the upper hard mask strips 131, for example, by chemical mechanical planarization (CMP). Each remaining portion of the dielectric material filling the second line trenches constitutes a dielectric rail structure 265. The remaining portion of the dielectric material in the contact region 300 constitutes a dielectric fill material portion 365.

Vertical field effect transistors are formed on the global bit lines 10. The vertical field effect transistors include a two-dimensional array of semiconductor pillars 14. The semiconductor pillars 14 can be laterally spaced among one another in the first horizontal direction hd1 by dielectric rail structures 265 that extend along the second horizontal direction hd2, and are laterally spaced among one another in the second horizontal direction hd2 by dielectric pillar structures 115. Each of the semiconductor pillars 14 comprises a bottom active region (e.g., source) 14B, a channel region 14C, and a top active region (e.g., drain) 14T. The source region 14B, the channel region 14C, the drain region 14T, the gate dielectric layer 15 and a portion of the gate electrode lines 16 adjacent to each channel region 14C form a vertical select transistor for the ReRAM device, Referring to FIGS. 15A-15F, at least one recess etch process can be performed to remove the upper hard mask strips 131 and the lower hard mask portions 121 and to vertically recess the dielectric pillar structures 115, the dielectric rail structures 265, and the dielectric fill material portion 365. In one embodiment, a plurality of recess etch processes can be performed to remove the upper hard mask strips 131 and the lower hard mask portions 121 and to vertically recess the dielectric pillar structures 115, the dielectric rail structures 265, and the dielectric fill material portion 365. Alternatively, a single recess etch process that recesses the materials of the upper hard mask strips 131, the lower hard mask portions 121, the dielectric pillar structures 115, the dielectric rail structures 265, and the dielectric fill material portion 365 at approximately the same rate can be performed to remove the upper hard mask strips 131 and the lower hard mask portions 121 and to vertically recess the dielectric rail structures 265 and the dielectric fill material portion 365. The top surfaces of the metallic nitride portions 19 can be physically exposed after the at least one recess etch process. The top surfaces of the metallic nitride portions 19 can be coplanar with, or substantially coplanar with, the top surfaces of the dielectric pillar structures 115, the dielectric rail structures 265, and the dielectric fill material portion 365.

Referring to FIGS. 16A-16E, a photoresist layer 237 is applied over the exemplary structure and is lithographically patterned to cover the contact regions 300, while not covering the memory array region 100. The dielectric pillar structures 115 and the dielectric rail structures 265 can be vertically recessed employing a combination of the photoresist layer 237 and the metallic nitride portions 19 as an etch mask. In one embodiment, the recessed top surfaces of the dielectric pillar structures 115 and the dielectric rail structures 265 can be at the same level as the interface between the semiconductor pillars 14 and the metal nitride portions 19. In another embodiment, the recessed top surfaces of the dielectric pillar structures 115 and the dielectric rail structures 265 can be located above the horizontal plane including the interface between the semiconductor pillars 14 and the metal nitride portions 19. In yet another embodiment, the recessed top surfaces of the dielectric pillar structures 115 and the dielectric rail structures 265 can be located below the horizontal plane including the interface between the semiconductor pillars 14 and the metal nitride portions 19. Physically exposed portions of the dielectric trench liner 113 and the dielectric rail liner 260 can be removed, for example, by an isotropic etch such as a wet etch. The photoresist layer 237 can be subsequently removed, for example, by ashing.

Referring to FIGS. 17A-17E, a dielectric material is deposited over, and among, the metal nitride portions 19 to form a blanket dielectric material layer 270L. As used herein, a "blanket" layer refers to a layer without any opening therein. Thus, the entire top surfaces of the metal nitride portions 19, the dielectric pillar structures 115, the dielectric rail structures 265, and the dielectric fill material portions 365 can be covered with, and can contact, the blanket dielectric material layer 270L. In one embodiment, the dielectric material, such as silicon nitride, can be deposited by a conformal deposition method such that the thickness over the metal nitride portions 19 is greater than twice the lateral separation distance between neighboring pairs of metal nitride portions 19.

In one embodiment, the thickness of the blanket dielectric material layer 270L can be selected such that each space between neighboring pairs of metal nitride portions 19 is filled with the dielectric material of the blanket dielectric material layer 270L. In one embodiment, the thickness of the blanket dielectric material layer 270L can be greater than one half of the lateral spacing between neighboring pairs of the metal nitride portions 19 that are spaced along the first horizontal direction hd1, and greater than one half of the lateral spacing between neighboring pairs of the metal nitride portions 19 that are spaced along the second horizontal direction hd2. For example, the thickness of the blanket dielectric material layer 270L can be in a range from 30 nm to 300 nm, although lesser and greater thicknesses can also be employed.

Referring to FIGS. 18A-18E, the blanket dielectric material layer 270L can be etched back uniformly until the top surfaces of the metal nitride portions 19 are physically exposed. An anisotropic etch process (such as a reactive ion etch process) or an isotropic etch process (such as a wet etch process) can be employed to recess top portions of the blanket dielectric material layer 270L. The deposited dielectric material of the blanket dielectric material layer 270L can be recessed from above the metal nitride portions 19. Remaining portions of the deposited dielectric material are continuously connected between the metal nitride portions 19 to provide a single continuous etch stop dielectric material layer, which is herein referred to as a patterned dielectric material layer 270. The patterned dielectric material layer 270 includes openings at locations of the metal nitride portions 19. In one embodiment, the patterned dielectric material layer 270 can include silicon nitride. In one embodiment, the top surface of the patterned dielectric material layer 270 can be coplanar with the top surfaces of the metal nitride portions 19. In another embodiment, the top surfaces of the patterned dielectric material layer 270 can be recessed below the horizontal plane including the top surfaces of the metal nitride portions 19. The patterned dielectric material layer 270 contacts top surfaces of the dielectric rail structures 265 and the dielectric pillar structures 115, and contacts sidewalls of the metal nitride portions 19 located over the two-dimensional array of semiconductor pillars 14.

Referring to FIGS. 19A-19E, an insulating material layer 280 can be formed over the patterned dielectric material layer 270 and the metal nitride portions 19. The insulating material layer 280 includes an insulating material such as silicon oxide. The insulating material layer 280 can be formed by chemical vapor deposition or spin coating. The thickness of the insulating material layer 280 can be from 40 nm to 200 nm, although lesser and greater thicknesses can also be employed.

A photoresist layer 247 can be applied over the exemplary structure, and can be lithographically patterned to form openings in the contact regions 300. An anisotropic etch process can be performed to form contact via cavities 349 that extend through the insulating material layer 280, the dielectric fill material portion 365, the dielectric rail liner 260, the planar dielectric material portion 40P, the planar dielectric liner 340, and the gate dielectric layer 15. A top surface of a global bit line 10 can be physically exposed at the bottom of each contact via cavity 349.

Referring to FIGS. 20A-20E, a metallic spacer 348A can be formed within each contact via cavity 349, for example, by conformal deposition of a metallic material layer (such as a TiN layer), and an anisotropic etch that removes horizontal portions of the metallic material layer. A metallic fill material portion 348B can be formed within each metallic spacer 348A by deposition of a metallic fill material, which can include copper, tungsten, aluminum, cobalt, other elemental metals, or an intermetallic alloy. The metallic fill material can be planarized such that the top surface of the metallic fill material portions 348B can be within the same horizontal plane as the top surface of the insulating material layer 280 to form a contact structure 348.

Referring to FIGS. 21A-21E, a layer stack including an alternating sequence of insulating layers 60 and electrically conductive layers 30 can be formed over the metal nitride portions 19 and over the patterned dielectric material layer 270 and the insulating material layer 280. The layer stack (60, 30) is herein referred to as an alternating stack (60, 30). Each electrically conductive layer 30 includes an electrically conductive material such as a metallic material (such as tungsten) and/or a heavily doped semiconductor material. Each insulating layer 60 includes an insulating material such as silicon oxide. The thickness of each electrically conductive layer 30 can be in a range from 15 nm to 100 nm, and the thickness of each insulating layer 60 can be in a range from 15 nm to 100 nm, although lesser and greater thicknesses can also be employed for the electrically conductive layers 30 and for the insulating layers 60. The number of repetitions of a pair of an electrically conductive layer 30 and an insulating layer 60 can be in a range from 4 to 1,024, although lesser and greater number of repetitions can also be employed.

An insulating cap layer 62 can be optionally formed. If present, the insulating cap layer 62 can be formed on the topmost electrically conductive layer 30, and can include the same material as the insulating layers 60. The thickness of the insulating cap layer 62 can be in a range from 30 nm to 300 nm, although lesser and greater thicknesses can also be employed. A sacrificial cap layer 64 can be optionally formed. If present, the sacrificial cap layer 64 can include a material that can be employed as a stopping layer for a planarization process (such as a chemical mechanical planarization process). In one embodiment, the sacrificial cap layer 64 includes silicon nitride. The thickness of the sacrificial cap layer 64 can be in a range from 30 nm to 300 nm, although lesser and greater thicknesses can also be employed.

Referring to FIGS. 22A-22E, a photoresist layer 257 can be applied over the exemplary structure, and can be lithographically patterned to cover the memory array region 100, and not to cover the contact regions 300. At least one etch process can be performed to remove the sacrificial cap layer 64, the insulating cap layer 62, and the alternating stack (60, 30) except the bottommost insulating layer 60 from each contact region 300.

Referring to FIGS. 23A-23E, a dielectric liner 66 can be formed over the sacrificial cap layer 64 and the bottommost insulating layer 60. The dielectric liner 66 can include silicon nitride, and can have a thickness in a range from 3 nm to 50 nm.

A dielectric fill material portion 375 can be formed in the contact region 300 by deposition and planarization of a dielectric material such as silicon oxide. The dielectric fill material portion 375 overlying the dielectric liner 66 is herein referred to as a memory level dielectric fill material portion. The dielectric liner 66 is used as a polish stop during the CMP of the dielectric fill material portion 375. In contrast, the dielectric fill material portion 365 laterally surrounding the contact via structure 348 is herein referred to as a transistor level dielectric fill material portion.

Referring to FIGS. 24A-24E, the top surface of each dielectric fill material portion 375 can be recessed approximately to the level of the interface between the insulating cap layer 62 and the sacrificial cap layer 64, for example, by a wet etch. The dielectric liner 66 and the sacrificial cap layer 64 can be removed from the memory array region 100 by an etch process, which may be an isotropic etch process (such as a wet etch process) or an anisotropic etch process (such as a reactive ion etch process). Further, the insulating cap layer 62 and the dielectric fill material portion 375 can be recessed such that the insulating cap layer 62 is thinned. For example, if the insulating cap layer 62 and the dielectric fill material portion 375 include silicon oxide, a wet etch employing hydrofluoric acid can be employed to recess the insulating cap layer 62 and the dielectric fill material portion 375.

An insulating material layer 68 can be optionally deposited over the insulating cap layer 62 and the dielectric fill material portion 375. The insulating material layer 68 can include, for example, silicon oxide. The thickness of the insulating material layer 68 can be in a range from 15 nm to 150 nm, although lesser and greater thicknesses can also be employed.

Figure 25F:
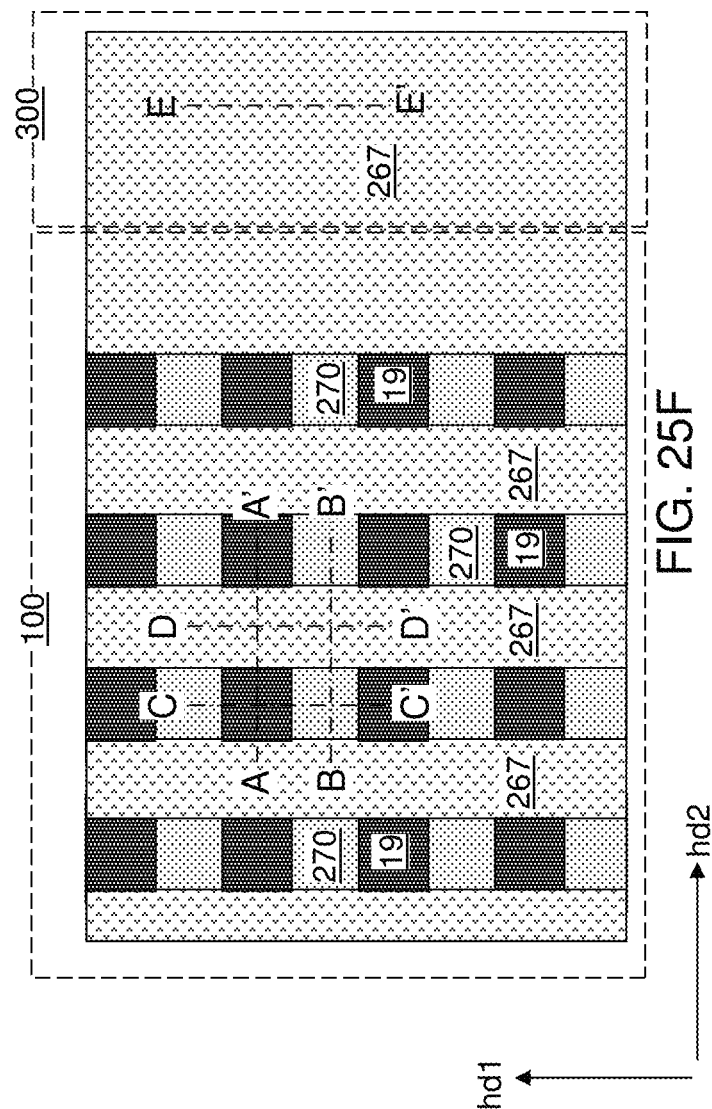

Referring to FIGS. 25A-25F, a photoresist layer 267 can be applied over the exemplary structure, and can be lithographically patterned to form line trenches that laterally extend along the first horizontal direction hd1. The areas of the line trenches overlap with the areas of the metal nitride portions 19. In one embodiment, the width of the line trenches in the photoresist layer 267 (as measured along the second horizontal direction hd2) can be substantially the same as the width of the metal nitride portions 19 along the second horizontal direction hd2.

An anisotropic etch can be performed to transfer the pattern of the line trenches in the photoresist layer 267 through the insulating material layer 68, the insulating cap layer 62, the alternating stack (60, 30), and the insulating material layer 280. Memory level trenches 249 are formed through the insulating material layer 68, the insulating cap layer 62, the alternating stack (60, 30), and the insulating material layer 280. Each patterned portion of the alternating sequence of the insulating layers 60 and the electrically conductive layers 30 becomes an alternating layer stack of strips of insulating layers 60 and strips of electrically conductive layers (e.g., word lines) 30 that laterally extend along the first horizontal direction hd1. In other words, each alternating layer stack (60, 30) comprises a vertically alternating sequence of insulating strips (i.e., strips of the insulating layers 60) and electrically conductive word line strips (i.e., strips of the electrically conductive layers 30). The alternating layer stacks (60, 30) are laterally spaced among one another by the memory level trenches 249.

The metal nitride portions 19 (which includes a conductive metal nitride such as TiN, TaN, WN, or a combination thereof) provide high selectivity to the etch process, and thus, function as an effective etch stop structure during the anisotropic etch process. The patterned dielectric material layer 270 (which can include silicon nitride) also functions as an etch stop structure. Thus, the patterned dielectric material layer 270 protects the underlying dielectric pillar structures 115 from being etched. However, silicon nitride is typically less resistant to the etch chemistry of the anisotropic etch process than a conductive metal nitride material. Thus, top surfaces of the patterned dielectric material layer 270 can be vertically recessed with respect to the top surfaces of the metal nitride portions 19, and with respect to the portions of the top surface of the patterned dielectric material layer 270 that is located under and contacts the insulating material layer 280. The photoresist layer 267 can be subsequently removed, for example, by ashing.

Referring to FIGS. 26A-26F, a sacrificial fill material is deposited in the memory level trenches 249. The sacrificial fill material includes a material that can be removed selective to the materials of the insulating material layer 68, the insulating cap layer 62, the alternating stack (60, 30), the insulating material layer 280, the metal nitride portions 19, and the patterned dielectric material layer 270. For example, the sacrificial fill material can include a semiconductor material such as amorphous silicon, polysilicon, or a silicon-germanium alloy. Excess portions of the sacrificial fill material can be removed from above the horizontal plane including the top surface of the insulating material layer 68, for example, by a recess etch or by chemical mechanical planarization (CMP). Each remaining portion of the sacrificial fill material in the memory level trenches 249 constitutes a sacrificial rail 450. Each sacrificial rail 450 can have a rectangular vertical cross-sectional shape along the widthwise direction, e.g., the second horizontal direction hd2.

Referring to FIGS. 27A-27E, a first hard mask layer 412 and a second hard mask layer 414 can be sequentially formed over the insulating material layer 68 and the sacrificial rails 450. The first hard mask layer 412 can include, for example, silicon nitride, and can have a thickness in a range from 40 nm to 200 nm, although lesser and greater thicknesses can also be employed. The second hard mask layer 414 can include, for example, silicon oxide, and can have a thickness in a range from 50 nm to 300 nm, although lesser and greater thicknesses can also be employed.

Referring to FIGS. 28A-28F, a photoresist layer 277 can be applied over the exemplary structure, and can be lithographically patterned to form line trenches that laterally extend along the second horizontal direction hd2. The areas of the patterned portions of the photoresist layer 277 overlap with the areas of the metal nitride portions 19. The pattern in the photoresist layer 277 can be transferred through the second hard mask layer 414 and an upper portion of the first hard mask layer 412 by an anisotropic etch process to form line trenches 259 in the first and second hard mask layers (412, 414).

Referring to FIGS. 29A-29E, the anisotropic etch of the first hard mask layer 412 can continue until the line trenches 259 extend into the insulating material layer 68. Top surfaces of the sacrificial rails 450 are physically exposed. Another anisotropic etch process is performed to remove portions of the sacrificial rails 450 that underlie the line trenches 259 and expose the patterned dielectric material layer 270. The patterned dielectric material layer 270 acts as an etch stop and again protects the underlying dielectric pillar structures 115 from being etched during this etching step. Memory level cavities 459 are formed in each volume from which a portion of the sacrificial rails 450 is removed. Thus, each memory level cavity 459 is formed within the area of an intersection between a line trench 259 and a sacrificial rail 450 (as provided prior to the anisotropic etch). Each remaining portion of the sacrificial rail 450 constitutes a sacrificial pillar structure 451. A sacrificial pillar structure 451 can be located between a neighboring pair of memory level cavities 459. In one embodiment, the memory level cavities 459 can be arranged as a two-dimensional periodic rectangular array. Each memory level cavity 459 is adjoined to a bottom portion of an overlying line trench 259.

Referring to FIGS. 30A-30E, an insulating liner 462 can be deposited on the sidewalls of the memory level cavities 459 and line trenches 259. The insulating liner 462 includes a dielectric material such as silicon nitride. The thickness of the insulating liner 462 can be in a range from 4 nm to 10 nm, although lesser and greater thicknesses can also be employed.

A dielectric material such as silicon oxide is deposited (e.g., by flowable CVD and/or densified TEOS CVD) in the remaining volumes of the memory level cavities 459 and the line trenches 259. Excess portions of the dielectric material can be removed from above the top surfaces of the first hard mask layer 412 by a planarization process such as chemical mechanical planarization. Remaining portions of the second hard mask layer 414 can be collaterally removed during the planarization process. Each remaining portion of the deposited dielectric material forms a memory level insulating rail 460. Each memory level insulating rail 460 includes a horizontally extending portion that is formed within a respective one of the line trenches 259 and a plurality of vertically extending portions that are formed in multiple memory level cavities 459.

Referring to FIGS. 31A-31E, the remaining portions of the first hard mask layer 412 can be removed selective to the memory level insulating rails 460, the insulating material layer 68, and the sacrificial pillar structures 451. For example, if the first hard mask layer 412 includes silicon nitride, a wet etch employing hot phosphoric acid can be employed to remove the first hard mask layer 412.

Figure 32F:
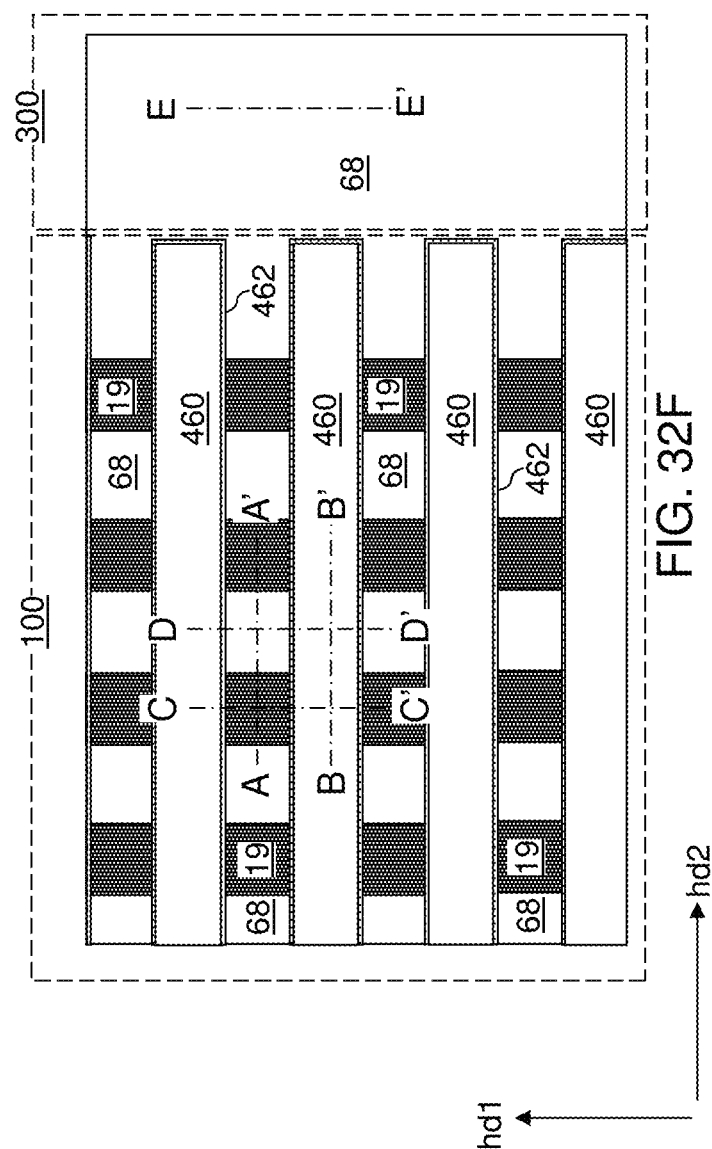

Referring to FIGS. 32A-32F, the remaining portions of the sacrificial rails 450, i.e., the sacrificial pillar structures 451, are removed selective to the insulating material layer 68, the memory level insulating rails 460, the metal nitride portions 19, and the alternating stacks (30, 60), i.e., the alternating layer stacks. In one embodiment, the sacrificial pillar structures 451 can include a semiconductor material such as amorphous silicon or polysilicon, and a wet etch process employing a solution that etches a semiconductor material (such as a KOH solution) can be employed to remove the sacrificial pillar structures 451. A two-dimensional array of cavities 469 can be formed among the alternating layer stacks (30, 60). A top surface of a metal nitride portion 19 can be physically exposed at the bottom of each cavity 469 because there is no silicon nitride etch stop layer located on the top surface of a metal nitride portion 19.

Referring to FIGS. 33A-33E, a memory film containing one or more various material layers (81, 82, 83) can be formed in each of the cavities 469 by conformal deposition processes. The memory film material layers (81, 82, 83) include a resistive memory material layer 82.

The memory film including the resistive memory material may be selected from: (i) a non-filamentary barrier modulated cell (BMC) which includes a barrier and an electrically conductive metal oxide whose resistivity is switched by at least one of oxygen ion and/or oxygen vacancy diffusion in response to an application of an electric field thereto; (ii) a phase change material portion providing at least two different levels of resistivity that depend on crystallinity; or (iii) a filamentary metal oxide portion (e.g., hafnium oxide layer) providing at least two different levels of resistivity depending on concentration of conductive filaments therein.

Each BMC can include a metal oxide resistive memory material having at least two resistive states having different resistivity. Examples of metal oxide materials include a slightly sub-stoichiometric metal oxide such as $TiO_{2-\delta}$, $SrTiO_{3-\delta}$, $NbO_{2-\delta}$, or $Nb:SrTiO_{3-\delta}$ where value of $\delta$ can be independently selected from a range from 0 to 0.5, such as greater than zero to 0.15 (i.e., to form a sub-stoichiometric, oxygen deficient metal oxide). For example, the metal oxide material may be titanium oxide, such as sub-stoichiometric titanium oxide having less than two oxygen atoms for each titanium atom. In one embodiment, the metal oxide may have a high concentration of free electrons in thermodynamic equilibrium in a range from $1.0 \times 10^{20}/cm^3$ to $1.0 \times 10^{21}/cm^3$. The memory cell may also include a barrier material, such as amorphous silicon or other suitable barrier materials. An interfacial barrier oxide is located between the metal oxide material and the barrier material. For an amorphous silicon barrier material, the interfacial barrier oxide may comprise silicon oxide. Without wishing to be bound by a particular theory, it is believed that the BMC ReRAM device operates as follows. The switching mechanism in BMC stack is generally understood as oxygen interstitial (Oi) generation in the interfacial barrier oxide (e.g., SiO$_2$) at the amorphous silicon (a-Si)/TiO$_{2-\delta}$ interface after a RESET operation (i.e., resetting the stack into the high resistivity state, HRS). The oxygen interstitials may drift into defect rich TiO$_{2-\delta}$ where they cause a re-oxidation of the TiO$_{2-\delta}$ (e.g., recombine with oxygen vacancies in the TiO$_{2-\delta}$ near the interface. This re-oxidation decreases the conductivity of the TiO$_{2-\delta}$ material and/or increases the thickness of the insulating interfacial barrier oxide and hence increases the resistance of the BMC memory cell. During the SET operation, opposite voltage is applied across the cell, and Ti—O bonds are supposed to be broken down to generate Oi and Vo (oxygen vacancy) pair in the titanium oxide layer. Oi may drift back to the a-Si/TiO$_{2-\delta}$ interface along the electric field to increase the conductivity of the TiO$_{2-\delta}$ layer and/or decrease the thickness of the insulating interfacial barrier oxide and hence decrease the resistance of the BMC memory cell to set the memory cell into the low resistivity state, LRS. Without wishing to be bound by a particular theory, it is believed that a BMC ReRAM device of the embodiments of the present disclosure may operate based on the principle described above and/or based on an alternative principle instead of or in addition to the principle described above. For example, the BMC ReRAM device may operate by modulation of energy band structure within the cell. When the charge carrier density is modulated, the resistance of the cell is changed. In other words, the resistance of the memory cell may be modulated by changes in the band structure and consequent changes in the charge distribution instead of or in addition to the change in thickness of the interfacial barrier oxide.

For example, for a BMC ReRAM device, the material layers (81, 82, 83) can include, from bottom to top, or from outside of each cavity 469 to inside of each cavity 469, a barrier material layer 81, a resistive memory material layer 82, and a conductive cover material layer 83. For example, the barrier material layer 81 can include a material that provides a suitable electronic barrier in a band structure, such as amorphous silicon, germanium, or carbon or combination thereof. The thickness of the barrier material layer 81 can be in a range from 2 nm to 20 nm, although lesser and greater thicknesses can also be employed. The resistive memory material layer 82 includes a resistive memory material, such as the titanium dioxide material described above. The thickness of the resistive memory material layer 82 can be in a range from 2 nm to 20 nm, although lesser and greater thicknesses can also be employed. The conductive cover material layer 83 includes a conductive material such as titanium nitride (TiN), tantalum nitride (TaN), titanium carbide (TiC), or tantalum carbide (TaC). The thickness of the conductive cover material layer 83 can be in a range from 2 nm to 20 nm, although lesser and greater thicknesses can also be employed. If desired, an additional aluminum oxide layer may also be added.

The resistive memory material layer 82 vertically extends from a bottommost one of the electrically conductive word line strips 30 to a topmost one of the electrically conductive word line strips 30. Portions of each resistive memory material layer 82 located at levels of the electrically conductive word line strips 30 constitute a respective vertical stack of resistive memory elements.

Referring to FIGS. 34A-34E, an anisotropic etch process is performed to remove horizontal portions of the material layers (81, 82, 83). Each remaining portion of the material layers (81, 82, 83) in the cavities can have a tubular configuration. A top surface of a metal nitride portion 19 is physically exposed at the bottom of each layer stack of the material layers (81, 82, 83) within a cavity. Since there is no silicon nitride etch stop layer located on top of the metal nitride portion 19, the top of the metal nitride portion 19 is exposed during this etching step to permit electrical contact to a subsequently formed vertical bit line. In contrast, a silicon nitride etch stop layer 270 is located over the dielectric pillar structures 115 which are located between the vertical select transistors (14B, 14C, 14T, 15, 16) to protect the dielectric pillar structures 115 during anisotropic etching steps.

The array of tubular portions of the resistive memory material layer 82 can be arranged as a two-dimensional array, thereby forming a two-dimensional of vertical stacks of resistive memory elements between neighboring pairs of alternating layer stacks (60, 30).

Referring to FIGS. 35A-35E, a conductive metallic liner 84 and a conductive fill material can be formed in remaining volumes of the cavities. The conductive metallic liner 84 includes a metallic material such as TiN, TaN, or WN. The conductive metallic liner 84 can be formed directly on the top surfaces of the metal nitride portions 19 and on the inner sidewalls of the conductive cover material layer 83 within each cavity. The thickness of the conductive metallic liner 84 can be in a range from 3 nm to 30 nm.

The conductive fill material can include a heavily doped semiconductor material (such as doped polysilicon) or a metallic material such as a conductive metal nitride (TiN) or an elemental metal (such as W or Co). In one embodiment, the conductive fill material can be doped polysilicon. The conductive fill material can completely fill remaining volumes of the cavities, and forms a conductive fill material layer 85L.

Figure 36F:
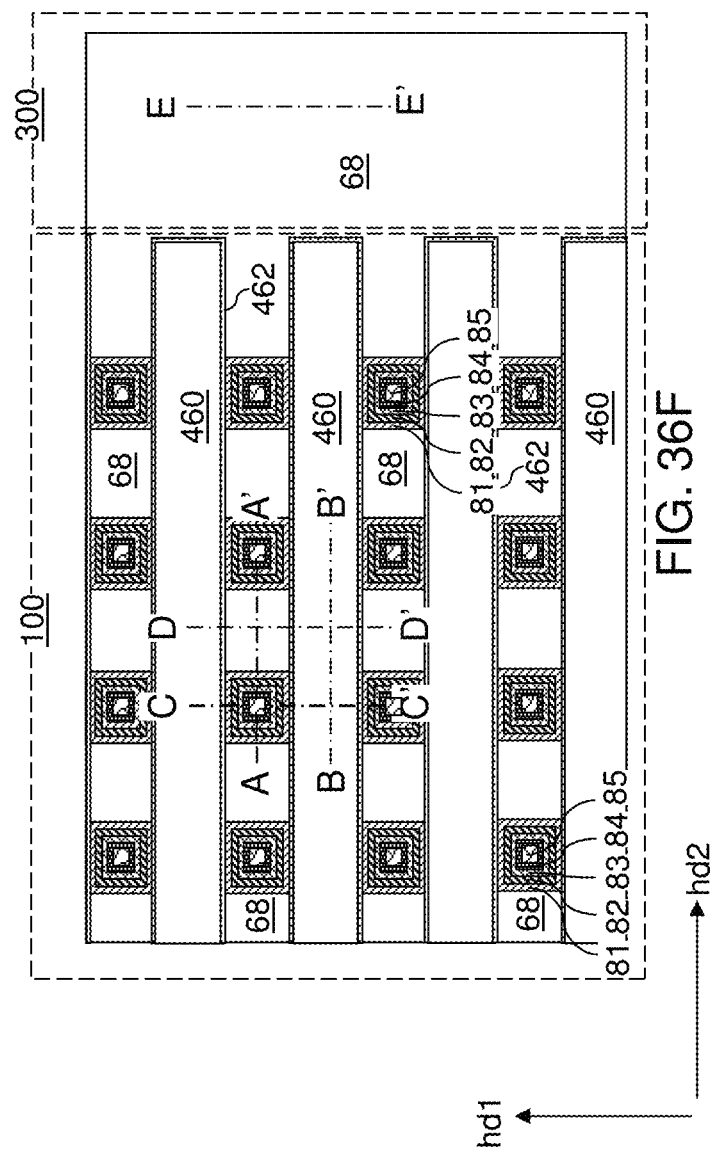
Figure 36G:
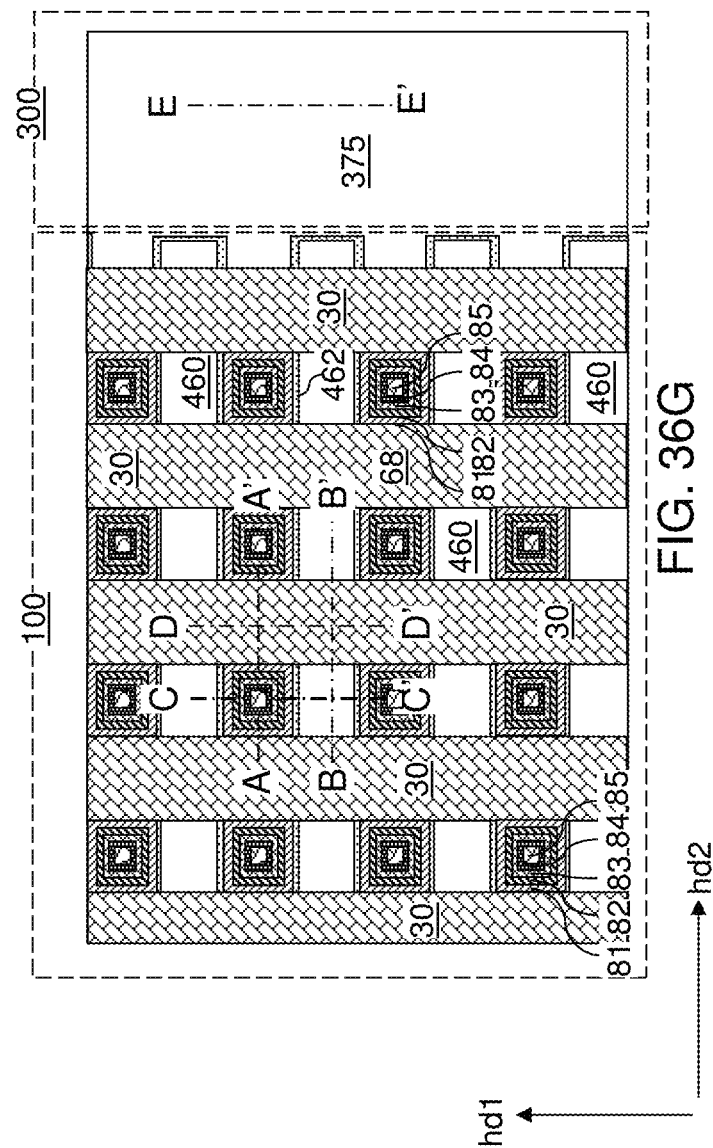

Referring to FIGS. 36A-36G, the conductive fill material layer 85L can be etched back, for example, by a recess etch. Portions of the conductive metallic liner 84 located above the topmost portions of the resistive memory material layers 82 can be removed, for example, by an isotropic etch. Each remaining portion of the conductive fill material layer 85L constitutes a conductive fill material portion 85. Each adjoining combination of a conductive cover material layer, a conductive metallic liner 84, and a conductive fill material portion 85 collectively constitutes a vertical bit line (i.e., local bit line) (83, 84, 85), which extends vertically through a layer stack including a barrier material layer 81 and a resistive memory material layer 82. The vertical bit lines (83, 84, 85) are formed within each of the vertical stacks of resistive memory elements (as embodied as portions of the resistive memory material layer 82 located at levels of the electrically conductive layers 30) and directly on a respective one of the metal nitride portions 19. Each vertical bit line (83, 84, 85) can directly contact a respective one of the metal nitride portions 19. The vertical bit lines (83, 84, 85) can constitute a two-dimensional array of vertical bit lines (83, 84, 85). In one embodiment, the two-dimensional array of vertical field effect transistors and the two-dimensional array of vertical bit lines (83, 84, 85) can have a same first periodicity along the first horizontal direction hd1 and a same second periodicity along the second horizontal direction hd2.

Referring to FIGS. 37A-37E, a planarization dielectric layer 490 can be formed over the vertical bit lines (83, 84, 85). The planarization dielectric layer 490 includes a dielectric material such as silicon oxide. The planarization dielectric layer 490 can be formed by a self-planarizing deposition process (such as spin coating), or can be deposited by a non-self-planarizing deposition process and subsequently planarized by a chemical mechanical planarization process.

Referring to FIGS. 38A-38E, an alternative embodiment of the exemplary structure is illustrated, in which the patterned dielectric material layer 270 is vertically recessed with respect to the horizontal plane including the top surfaces of the metal nitride portions 19 at the processing steps of FIGS. 18A-18E. In this case, the interface between the patterned dielectric material layer 270 and the insulating material layer 280 can be located below the horizontal plane including the top surfaces of the metal nitride portions 19.

According to the various embodiments of the present disclosure, a resistive memory device is provided, which comprises a two-dimensional array of vertical field effect transistors located over a substrate 6 and including a two-dimensional array of semiconductor pillars 14 laterally spaced among one another by dielectric rail structures 265 that extend along in a first horizontal direction hd1, and laterally spaced among one another in the second horizontal direction hd2 by dielectric pillar structures 115; an etch stop dielectric material layer 270 contacting top surfaces of the dielectric rail structures 265 and the dielectric pillar structures 115 and including openings in areas that overlie the two-dimensional array of semiconductor pillars 14; an array of metal nitride portions 19 located within the openings in the etch stop dielectric material layer 270 and electrically connected to top surfaces of each semiconductor pillar 14 within the two-dimensional array of semiconductor pillars 14; a two-dimensional array of vertical bit lines electrically connected to the metallic nitride portions 19, wherein a vertical stack of resistive memory elements (for example, as embodied as portions of the resistive memory material layer 82 at levels of the electrically conductive layers 30) is located on each of the vertical bit lines (83, 84, 85) to provide a three-dimensional memory element array; and alternating layer stacks (60, 30) located between neighboring rows of the vertical bit lines (83, 84, 85) and overlying the etch stop dielectric material layer 270. Each of the alternating layer stacks (60, 30) comprises a vertically alternating sequence of insulating strips 60 and electrically conductive word line strips 30.

In one embodiment, a horizontal plane including interfaces between the vertical bit lines (83, 84, 85) and the metal nitride portions 19 is located at, or above, a horizontal plane including a topmost surface of the etch stop dielectric material layer 270. In one embodiment, the metal nitride portions 19 can have a thickness in a range from 25 nm to 100 nm. The thickness of the metal nitride portions 19 can be greater than the maximum thickness of the etch stop dielectric material layer 270. In one embodiment, the metal nitride portions 19 comprises a material selected from TiN, TaN, and WN, and the etch stop dielectric material layer 270 comprises silicon nitride. In one embodiment, sidewalls of the metal nitride portions 19 can be vertically coincident with sidewalls of semiconductor pillars 14.

In one embodiment, each of the semiconductor pillars 14 comprises, from bottom to top, a source region comprising a bottom active region 14B having a doping of a first conductivity type, a channel region 14C having a doping of a second conductivity type, and a drain region comprising a top active region 14T having a doping of the first conductivity type. The vertical field effect transistors can further comprise: gate dielectric layers 15 extending parallel to the dielectric rail structures 265 and contacting sidewalls of the semiconductor pillars 14; and gate electrode lines 16 extending parallel to the dielectric rail structures 265 and contacting a sidewall of a respective one of the gate dielectric layers 15.

The resistive memory device can further comprise: dielectric rail liners 260 contacting upper portions of the semiconductor pillars 14, upper portions of the dielectric pillar structures 115, and sidewalls of the gate electrode lines 16; and dielectric trench liners 113 contacting a respective one of the dielectric pillar structures 115 and a bottom surface of the etch stop dielectric material layer 270. In one embodiment, each of the dielectric trench liners 113 includes two vertical portions and a horizontal portion adjoined to bottom ends of the two vertical portions, and vertically extends from a bottom edge of a sidewall of one of the semiconductor pillars 14 to a top edge of the sidewall of the one of the semiconductor pillars 14.

In one embodiment, the vertical stack of resistive memory elements comprises a vertical stack of barrier modulated cells. Each of the vertical bit lines (83, 84, 85) can be laterally surrounded by a respective resistive memory material layer 82 that vertically extends from a bottommost one of the electrically conductive word line strips 30 to a topmost one of the electrically conductive word line strips 30, wherein portions of each resistive memory material layer 82 located at levels of the electrically conductive word line strips 30 constitute a respective vertical stack of resistive memory elements.

In one embodiment, the two-dimensional array of vertical field effect transistors and the two-dimensional array of vertical bit lines (83, 84, 85) can have a same first periodicity along the first horizontal direction hd1 and a same second periodicity along the second horizontal direction hd2.

In one embodiment, the resistive memory device can further comprise a one-dimensional array of global bit lines 10 electrically connected to bottom portions of a respective row of semiconductor pillars 14, wherein each row of semiconductor pillars 14 laterally extends along the first horizontal direction hd1 or the second horizontal direction hd2.

According to an aspect of the present disclosure, the metal nitride portions 19 are formed with enough thickness to function as a reliable etch stop structure such that a separate silicon nitride etch stop layer is omitted over the metal nitride portions 19. By forming thick enough metal nitride portions 19 and eliminating silicon nitride etch stop structures, a more reliable etch process can be provided for forming the memory level trenches 249 and connection of the metal nitride portions 19 to the vertical bit lines.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A resistive memory device, comprising:
   a two-dimensional array of vertical field effect transistors located over a substrate and including a two-dimensional array of semiconductor pillars laterally spaced among one another by dielectric rail structures that extend along in a first horizontal direction, and laterally spaced among one another in the second horizontal direction by dielectric pillar structures;

an etch stop dielectric material layer overlying top surfaces of the dielectric rail structures and the dielectric pillar structures and including openings in areas that overlie the two-dimensional array of semiconductor pillars;

an array of metal nitride portions located within the openings in the etch stop dielectric material layer and electrically connected to top surfaces of each semiconductor pillar within the two-dimensional array of semiconductor pillars;

a two-dimensional array of vertical bit lines electrically connected to the metallic nitride portions;

alternating layer stacks located between neighboring rows of the vertical bit lines and overlying the etch stop dielectric material layer, wherein each of the alternating layer stacks comprises a vertically alternating sequence of insulating strips and electrically conductive word line strips; and a vertical stack of resistive memory elements located between each of the vertical bit lines and alternating layer stacks to provide a three-dimensional resistive memory element array.

2. The resistive memory device of claim 1, wherein a horizontal plane including interfaces between the vertical bit lines and the metal nitride portions is located at, or above, a horizontal plane including a topmost surface of the etch stop dielectric material layer.

3. The resistive memory device of claim 1, wherein:
a thickness of the metal nitride portions is greater than a thickness of the etch stop dielectric material layer;
the metal nitride portions comprises a material selected from TiN, TaN, and WN; and
the etch stop dielectric material layer comprises silicon nitride.

4. The resistive memory device of claim 1, wherein sidewalls of the metal nitride portions are vertically coincident with sidewalls of semiconductor pillars.

5. The resistive memory device of claim 1, wherein the vertical field effect transistors comprise:
source regions comprising bottom active regions of the semiconductor pillars and having a doping of a first conductivity type;
channel regions located in the semiconductor pillars and having a doping of a second conductivity type;
drain regions comprising top active regions of the semiconductor pillars and having a doping of the first conductivity type;
gate dielectric layers extending parallel to the dielectric rail structures and contacting sidewalls of the semiconductor pillars; and
gate electrode lines extending parallel to the dielectric rail structures and contacting a sidewall of a respective one of the gate dielectric layers.

6. The resistive memory device of claim 5, further comprising:
dielectric rail liners contacting upper portions of the semiconductor pillars, upper portions of the dielectric pillar structures, and sidewalls of the gate electrode lines; and
dielectric trench liners contacting a respective one of the dielectric pillar structures and a bottom surface of the etch stop dielectric material layer,
wherein each of the dielectric trench liners includes two vertical portions and a horizontal portion adjoined to bottom ends of the two vertical portions, and vertically extends from a bottom edge of a sidewall of one of the semiconductor pillars to a top edge of the sidewall of the one of the semiconductor pillars.

7. The resistive memory device of claim 1, wherein the vertical stack of resistive memory elements comprises a vertical stack of barrier modulated cells.

8. The resistive memory device of claim 1, wherein each of the vertical bit lines is laterally surrounded by a respective resistive memory material layer that vertically extends from a bottommost one of the electrically conductive word line strips to a topmost one of the electrically conductive word line strips, wherein portions of each resistive memory material layer located at levels of the electrically conductive word line strips constitute a respective vertical stack of resistive memory elements.

9. The resistive memory device of claim 1, wherein the two-dimensional array of vertical field effect transistors and the two-dimensional array of vertical bit lines have a same first periodicity along the first horizontal direction and a same second periodicity along the second horizontal direction.

10. The resistive memory device of claim 1, further comprising a one-dimensional array of global bit lines electrically connected to bottom portions of a respective row of semiconductor pillars, wherein each row of semiconductor pillars laterally extends along the first horizontal direction or the second horizontal direction.

* * * * *